United States Patent
Fujii et al.

(10) Patent No.: US 9,091,926 B2
(45) Date of Patent: Jul. 28, 2015

(54) METHOD OF MAKING PLANOGRAPHIC PRINTING PLATE AND PLANOGRAPHIC PRINTING PLATE

(71) Applicant: FUJIFILM CORPORATION, Minato-ku, Tokyo (JP)

(72) Inventors: Shigekatsu Fujii, Shizuoka-ken (JP); Yuichi Yasuhara, Shizuoka-ken (JP); Yoshinori Taguchi, Shizuoka-ken (JP); Norio Aoshima, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/756,538

(22) Filed: Feb. 1, 2013

(65) Prior Publication Data

US 2013/0255516 A1    Oct. 3, 2013

(30) Foreign Application Priority Data

Mar. 30, 2012  (JP) ................ 2012-082215

(51) Int. Cl.
| G03F 7/00 | (2006.01) |
| G03F 7/20 | (2006.01) |
| B41C 1/10 | (2006.01) |
| B41N 3/08 | (2006.01) |

(Continued)

(52) U.S. Cl.
CPC ............ *G03F 7/20* (2013.01); *B41C 1/1008* (2013.01); *B41C 1/1016* (2013.01); *B41N 1/00* (2013.01);

(Continued)

(58) Field of Classification Search
CPC ............. B41C 1/1008; B41C 2210/02; B41C 2210/22; B41C 2210/24
USPC ............. 101/450.1, 453, 463.1; 430/270.1, 430/271.1, 283.1, 300–309
See application file for complete search history.

(56) References Cited

U.S. PATENT DOCUMENTS

| 6,158,856 A | * | 12/2000 | Sato et al. ................ 347/101 |
| 2009/0305164 A1 | * | 12/2009 | Lingier .................... 430/302 |
| 2011/0226145 A1 | * | 9/2011 | Watanabe ................. 101/453 |

FOREIGN PATENT DOCUMENTS

| EP | 1834803 B1 | 7/2011 |
| EP | 2366546 A | 9/2011 |

(Continued)

OTHER PUBLICATIONS

Extended European Search Report dated Jun. 5, 2013 from the EPO in an European patent application corresponding to the instant patent application.

(Continued)

*Primary Examiner* — Chanceity Robinson
(74) *Attorney, Agent, or Firm* — Solaris Intellectual Property Group, PLLC

(57) ABSTRACT

A method of making a planographic printing plate includes exposing, to infrared light, a planographic printing plate precursor including a recording layer provided on a substrate, and developing the precursor using an aqueous alkaline solution. The recording layer comprises a copolymer containing a structural unit derived from (meth)acrylonitrile and at structural unit derived from styrene, a water-insoluble and alkali-soluble resin, and an infrared absorbing agent, the solubility of the recording layer in the aqueous alkaline solution being increased by the exposure. The aqueous alkaline solution has a pH of 8.5 to 10.8 and contains a betaine-based amphoteric surfactant and an ammonium salt represented by Formula (I):

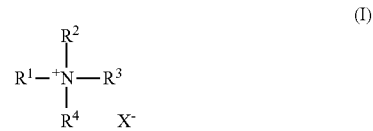

$R^1$, $R^2$, $R^3$, and $R^4$ each independently represent an alkyl or aryl group; the total number of carbon atoms in $R^1$, $R^2$, $R^3$, and $R^4$ is not more than 20; and $X^-$ represents a counter anion.

18 Claims, 1 Drawing Sheet

(51) Int. Cl.
  *G03F 7/32* (2006.01)
  *B41N 1/00* (2006.01)
(52) U.S. Cl.
  CPC *B41N 3/08* (2013.01); *G03F 7/322* (2013.01); *B41C 2201/04* (2013.01); *B41C 2201/06* (2013.01); *B41C 2201/10* (2013.01); *B41C 2201/14* (2013.01); *B41C 2210/02* (2013.01); *B41C 2210/06* (2013.01); *B41C 2210/14* (2013.01); *B41C 2210/22* (2013.01); *B41C 2210/24* (2013.01); *B41C 2210/26* (2013.01); *B41C 2210/262* (2013.01); *B41C 2210/266* (2013.01)

(56) References Cited

FOREIGN PATENT DOCUMENTS

| | | |
|---|---|---|
| JP | 2011-197303 A | 10/2011 |
| WO | 2009/094120 A1 | 7/2009 |

OTHER PUBLICATIONS

Office action dated Feb. 4, 2014 from the Japanese Patent Office in a Japanese patent application corresponding to the instant patent application.

* cited by examiner

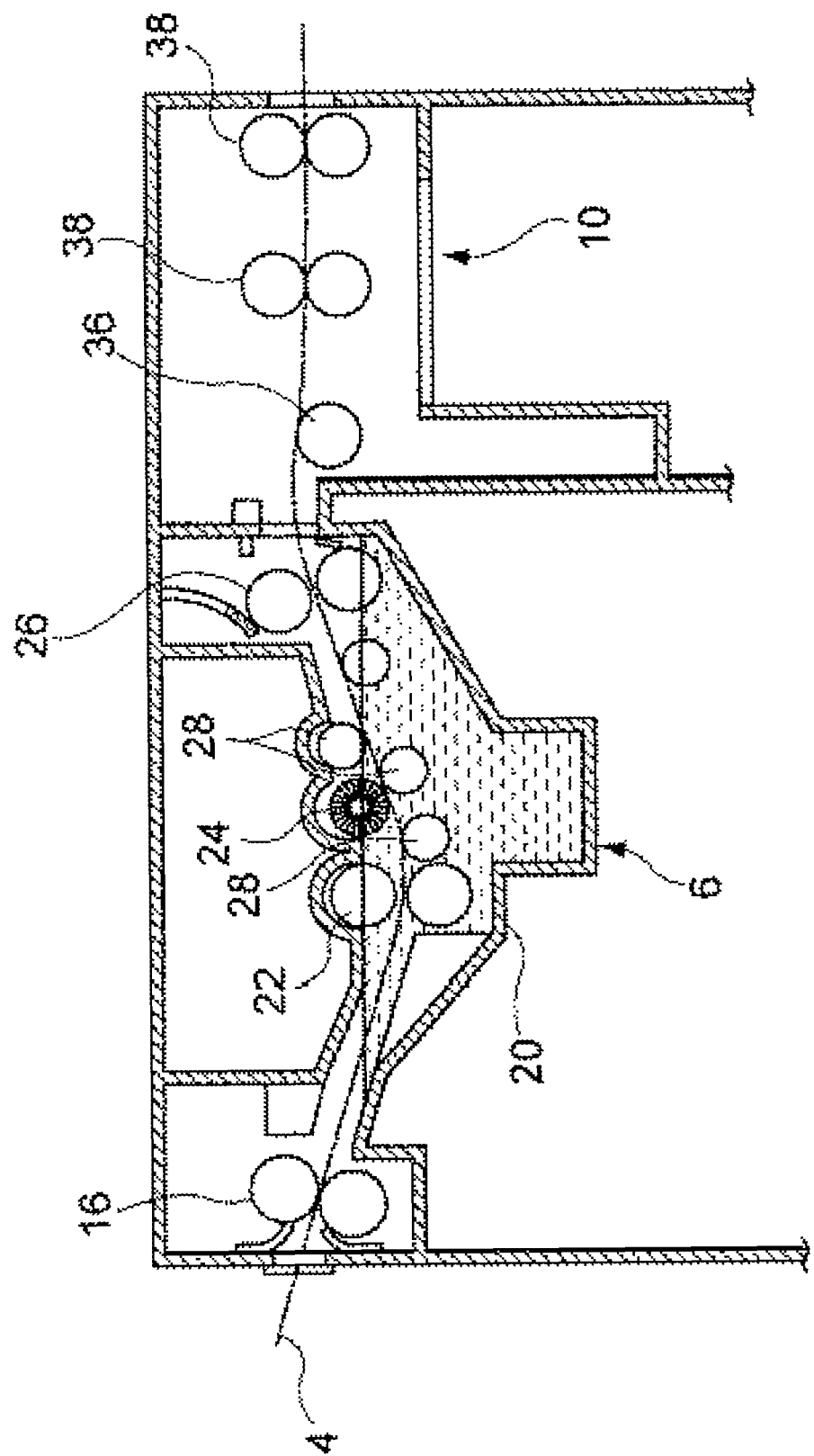

METHOD OF MAKING PLANOGRAPHIC PRINTING PLATE AND PLANOGRAPHIC PRINTING PLATE

CROSS-REFERENCE TO RELATED APPLICATION

This application claims priority under 35 USC 119 from Japanese Patent Application No. 2012-082215 filed on Mar. 30, 2012, the disclosure of which is incorporated by reference herein.

BACKGROUND OF THE INVENTION

1. Field of the Invention

The invention relates to a method of making a planographic printing plate and a planographic printing plate obtained by using the method.

2. Description of the Related Art

The development of lasers in recent years has been remarkable and, in particular, with regard to solid-state lasers or semiconductor lasers capable of emitting light in the range from near-infrared to infrared, compact devices having high output are readily available. Conventionally, a variety of photosensitive compositions have been used as visible image forming materials or materials forming a recording layer of a planographic printing plate precursor. These lasers are very useful an exposure lights source when carrying out direct forming an image on the photosensitive compositions based on a digital data signal sent from a computer or the like.

A positive-working planographic printing plate precursor for an infrared laser contains as essential components an alkali-soluble binder resin, an infrared absorbing agent (hereinafter also called an "IR dye") that absorbs infrared light and generates heat, or the like. In unexposed areas (image areas) the IR dye or the like functions as a dissolution inhibitor that substantially degrades the solubility of a binder resin in a developing solution by interacting with the binder resin. Meanwhile, in exposed areas (non-image areas), heat generated therein weakens the interaction between the IR dye or the like and the binder resin, whereby the exposed region dissolves in an alkaline developer to form a planographic printing plate.

However, in such a positive-working planographic printing plate precursor for an infrared laser, it cannot be said that there is sufficient difference between dissolution resistance of non-exposed areas (image areas) in a developer and the solubility of exposed areas (non-image areas) in the developer under various conditions of use, and there is the problem in that variations in the conditions of use result in susceptibility to over-development or under-development. Furthermore, fine scratches are formed by, for example, touching the surface during handling or the like, the surface state is thus easily changed, and when such a slight change in the surface state occurs, the unexposed areas (image areas) dissolve during development to form a scratch mark, causing deterioration of printing durability or poor inking properties.

Such problems are derived from an intrinsic difference in platemaking mechanism between the positive-working planographic printing plate precursor for an infrared laser and a positive-working planographic printing plate material processed by UV exposure. That is, the positive-working planographic printing plate precursor processed by UV exposure contains as essential components an aqueous alkaline solution-soluble binder resin and an onium salt or a quinone diazide compound. The onium salt or quinone diazide compound not only functions as a dissolution inhibitor by interaction with the binder resin in the unexposed areas (image areas) but also functions as a dissolution accelerator in the exposed areas (non-image areas) by decomposing under light and generating an acid.

In contrast, the IR dye or the like in the positive-working planographic printing plate precursor for an infrared laser functions only as a dissolution inhibitor for unexposed areas (image areas) and does not accelerate dissolution in exposed areas (non-image areas). Therefore, when a binder resin highly soluble in an alkaline developer is used in order to enhance the difference in solubility between unexposed areas and exposed areas of the positive-working planographic printing precursor for an infrared laser, there are the problems that the developer resistance of unexposed areas (image areas) upon development is instable, large development latitude cannot be obtained, and scratch resistance of the image areas is insufficient.

Meanwhile, platemaking methods by means of infrared laser exposure have been proposed in view of the various problems of positive-working planographic printing plate precursors. For example, European Patent No. 1834803 discloses a platemaking method that uses a developer containing at least two onium groups in which insufficient development latitude is improved. Japanese Patent Application Laid Open (JP-A) No. 2011-197303 discloses a platemaking method in which a planographic printing plate precursor, which has a positive-working recording layer that includes an upper layer containing a copolymer having a specific structural unit and a lower layer containing a water-insoluble and alkali-soluble resin and an infrared absorbing agent, is developed with an aqueous alkaline solution containing a betaine-based surfactant and having a predetermined pH value; and that the generation of development scum is suppressed and the developability of the planographic printing plate precursor after time has elapsed is improved.

From the viewpoint of handling a developer and the ease of waste liquid disposal, it is preferable to adjust the pH value of an alkaline developer used in a development step for platemaking from a positive-working planographic printing plate precursor to near-neutral, and various attempts have been made in this regard. For example, a platemaking method in which a planographic printing plate precursor having a positive-working image recording layer having a multilayer structure is treated with a developer having a pH of from 6 to 11 has been proposed (for example, see WO 2009/094120).

SUMMARY OF THE INVENTION

However, in a platemaking method as described in WO 2009/094120 that merely uses an alkaline developer having a low pH value, there may be a problem in that generation of development scum is increased due to a deterioration in developability (in other words, a decrease in dissolution properties) of the image recording layer when the platemaking process is repeated using an automatic developer. Therefore, there is significant concern that development scum attached to the surface of the obtained plate will cause image defects. When platemaking is carried out using a treatment liquid containing a surfactant to address this issue, while concerns over the generation of development scum are reduced, there is a problem that the solubility of unexposed areas (image areas) in the treatment liquid is simultaneously increased, resulting in susceptibility to excessive development. Accordingly, a platemaking technique using a positive-working planographic printing plate precursor by means of infrared exposure, while achieving both dissolution resistance of unexposed areas (image areas) and solubility in exposed areas (non-image areas), using an alkaline developer having a low pH value, has not yet been proposed.

The invention has been made in view of the above circumstances and it is an object of the invention to provide a method of making a planographic printing plate in which both dissolution resistance of unexposed areas (image areas) and solubility in exposed areas (non-image areas) are achieved using an aqueous alkaline solution having a low pH value in a development process, and a planographic printing plate obtained by the method.

This object of the invention is attained by the following means.

<1> A method of making a planographic printing plate, the method including, in this order:

image-wise exposing, to infrared light, a positive-working planographic printing plate precursor including a positive-working recording layer provided on a substrate; and developing the positive-working planographic printing plate precursor after the exposure using an aqueous alkaline solution, wherein the positive-working recording layer includes a copolymer (A) containing a structural unit derived from (meth)acrylonitrile and a structural unit derived from styrene, a water-insoluble and alkali-soluble resin (B), and an infrared absorbing agent (C), the solubility of the positive-working recording layer in the aqueous alkaline solution being increased by the exposure to infrared light, and wherein the aqueous alkaline solution has a pH of from 8.5 to 10.8 and contains a betaine-based amphoteric surfactant and an ammonium salt represented by the following Formula (I).

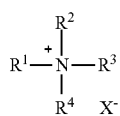

In Formula (I), $R^1$, $R^2$, $R^3$, and $R^4$ each independently represent an alkyl group or an aryl group, and the total number of carbon atoms contained in $R^1$, $R^2$, $R^3$, and $R^4$ is not more than 20. $X^-$ represents a counter anion.

<2> The method of making a planographic printing plate according to <1>, in which the positive-working recording layer has a multilayer structure including an upper layer that contains the copolymer (A) containing a structural unit derived from (meth)acrylonitrile and a structural unit derived from styrene, and a lower layer that contains the water-insoluble and alkali-soluble resin (B), and in which either one or both of the upper and lower layers includes the infrared absorbing agent (C).

<3> The method of making a planographic printing plate according to <1> or <2>, wherein the copolymer (A) further includes a structural unit derived from an ethylenically unsaturated monomer having an alkali-soluble group.

<4> The method of making a planographic printing plate according to any one of <1> to <3>, wherein the water-insoluble and alkali-soluble resin (B) is a polymer formed by polymerization of at least one selected from the group consisting of an ethylenically unsaturated monomer having an acidic group, an alkyl (meth)acrylate, a (meth)acrylic acid ester having an aliphatic hydroxy group, (meth)acrylamide, a vinyl ester, a styrene compound, a nitrogen atom-containing monomer, and a maleimide compound.

<5> The method of making a planographic printing plate according to any one of <1> to <4>, wherein the positive-working recording layer further includes at least one selected from the group consisting of an alkali-soluble polyurethane resin, an alkali-soluble phenol resin, an alkali-soluble resin having a urea bond in a side chain thereof, an alkali-soluble polyamide resin, an alkali-soluble epoxy resin, an alkali-soluble polyacetal resin, and an alkali-soluble polystyrene-based resin.

<6> The method of making a planographic printing plate according to any one of <1> to <5>, in which the alkyl group represented by $R^1$, $R^2$, $R^3$ or $R^4$ in Formula (I) is an alkyl group having 1 to 6 carbon atoms.

<7> The method of making a planographic printing plate according to <1>, in which two alkyl groups among $R^1$, $R^2$, $R^3$, and $R^4$ in Formula (I) link to each other to form a ring structure.

<8> The method of making a planographic printing plate according to <1>, in which the total number of carbon atoms contained in $R^1$, $R^2$, $R^3$, and $R^4$ in Formula (I) is from 8 to 20.

<9> The method of making a planographic printing plate according to <1>, wherein $X^-$ in Formula (I) is selected from the group consisting of a fluorine ion, a chlorine ion, a bromine ion, an iodine ion, and a hydroxide ion.

<10> The method of making a planographic printing plate according to <1>, in which the betaine-based amphoteric surfactant is a compound represented by the following Formula (A) or Formula (B):

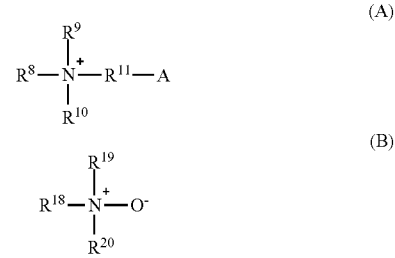

wherein, in Formula (A), $R^8$ represents an alkyl group; $R^9$ and $R^{10}$ each independently represent a hydrogen atom or an alkyl group; $R^{11}$ represents an alkylene group; and A represents a carboxylate ion or a sulfonate ion, and in Formula (B), $R^{18}$, $R^{19}$, and $R^{20}$ each independently represent a hydrogen atom or an alkyl group, provided that $R^{18}$, $R^{19}$, and $R^{20}$ are not simultaneously hydrogen atoms.

<11> A planographic printing plate obtained by the method according to any one of <1> to <10>.

According to the invention, there can be provided a method of making a planographic printing plate precursor in which both dissolution resistance of unexposed areas (image areas) and solubility in exposed areas (non-image areas) are achieved by using an aqueous alkaline solution having a low pH value for development, and a planographic printing plate obtained by the method.

BRIEF DESCRIPTION OF THE DRAWING

FIG. 1 is an explanatory diagram showing a configuration of an automatic development processor.

DETAILED DESCRIPTION OF THE INVENTION

Hereinbelow, the invention is described in detail.

Although the explanation of the constituent features described hereinbelow are made based on representative embodiments of the invention, the invention is not limited unless departing from the scope of the invention.

In this specification, the notation "A to B" expressing a numerical range represents a range including the numerical values A and B, as the minimum value and the maximum value, respectively.

With regard to the amount of a component of a composition, when plural substances corresponding to the same component exist in the composition, the amount of the component refers to a total amount of the plural substances in the composition unless otherwise specified.

With regard to the notation of a group (including an atomic group), the notation without "substituted" or "unsubstituted" includes both a group with a substituent and a group without a substituent. For example, an "alkyl group" includes not only an alkyl group having no substituent (unsubstituted alkyl group) but also an alkyl group having a substituent (substituted alkyl group).

As used herein, the term "(meth)acrylic acid" indicates both or any one of acrylic acid and methacrylic acid, and the term "(meth)acrylate" indicates both or any one of acrylate and methacrylate.

As used herein, unless otherwise specified, the term "content" refers to a content in terms of mass, the term "% by mass" refers to the proportion of each component with respect to a total mass of a composition, and the term "solid content" refers to a total amount of the ingredients included in a composition other than solvent(s).

As used herein, the term "process" indicates not only a separate process but also a process that is not clearly distinguished from other process as long as the desired effect of the process is obtained therefrom.

The method of making a planographic printing plate according to the invention includes, in this order, image-wise exposing to infrared light a positive-working planographic printing plate precursor including a positive-working recording layer provided on a substrate; and developing the positive-working planographic printing plate precursor using an aqueous alkaline solution after the exposure, in which the positive-working recording layer includes a copolymer (A) containing a structural unit derived from (meth)acrylonitrile and a structural unit derived from styrene, a water-insoluble and alkali-soluble resin (B), and an infrared absorbing agent (C), the solubility of the positive-working recording layer in the aqueous alkaline solution being increased by the exposure to infrared light, and in which the aqueous alkaline solution has a pH of from 8.5 to 10.8 and includes a betaine-based amphoteric surfactant and an ammonium salt represented by the following Formula (I).

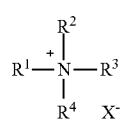

(I)

In Formula (I), $R^1$, $R^2$, $R^3$, and $R^4$ each independently represent an alkyl group or an aryl group, and the total number of carbon atoms contained in $R^1$, $R^2$, $R^3$, and $R^4$ is not more than 20. $X^-$ represents a counter anion.

The method of making a planographic printing plate according to the invention ensures both dissolution resistance of unexposed areas in the aqueous alkaline solution and solubility of exposed areas (non-image areas) in the aqueous alkaline solution, even though the aqueous alkaline solution having a low pH value (pH of from 8.5 to 10.8) is used in the development step. Furthermore, the method of making a planographic printing plate according to the invention can improve the development latitude and the scratch resistance of image areas.

A planographic printing plate according to the invention is obtained by the planographic printing platemaking method of the invention and has excellent scratch resistance in image areas.

The method of making a planographic printing plate according to the invention is based on findings of the inventors that, in development using a low pH (from 8.5 to 10.8) alkaline developer, the dissolution resistance of unexposed areas in the positive-working recording layer significantly increases when the aqueous alkaline solution used as the developer includes both amphoteric surfactant capable of serving as a development accelerator and ammonium salt represented by Formula (I) capable of serving as a development inhibitor.

Hereinafter, a positive-working planographic printing plate precursor used in the platemaking method according to the invention is described in detail, followed by a detailed description of the method of making the planographic printing plate according to the invention.

Positive-Working Planographic Printing Plate Precursor

The positive-working planographic printing plate precursor used in the platemaking method of the invention (hereinafter may be referred to as "planographic printing plate precursor") includes a positive-working recording layer provided on a substrate, the positive-working recording layer including a copolymer (A) containing a structural unit derived from (meth)acrylonitrile and a structural unit derived from styrene, a water-insoluble and alkali-soluble resin (B), and an infrared absorbing agent (C), the solubility of the positive-working recording layer in an aqueous alkaline solution being increased by the exposure to infrared light.

If necessary, in addition to the positive-working recording layer, the planographic printing plate precursor may include another layer such as a surface protection layer or an undercoat layer, as long as the effects of the invention are not impaired. On a surface of the substrate opposite to the surface where there is a recording layer, the planographic printing plate precursor of the invention is provided with a backcoat layer or the like if necessary.

Positive-Working Recording Layer

The positive-working recording layer in the invention (hereinafter simply referred to as "recording layer" sometimes) is a positive-working recording layer including a copolymer (A) containing a structural unit derived from (meth)acrylonitrile and a structural unit derived from styrene, a water-insoluble and alkali-soluble resin (B), and an infrared absorbing agent (C), the solubility of the positive-working recording layer in an aqueous alkaline solution being increased by the exposure to infrared light.

The recording layer may have a single layer structure or a multilayer structure including an upper layer and a lower layer. In the positive-working recording layer having a multilayer structure, the lower layer is located between the upper layer and the substrate.

When the recording layer has a multilayer structure, it is preferable that the recording layer has a multilayer structure including an upper layer that contains the copolymer (A) containing a structural unit derived from (meth)acrylonitrile and a structural unit derived from styrene, and a lower layer that contains the water-insoluble and alkali-soluble resin (B), in which either one or both of the upper and lower layers includes the infrared absorbing agent (C).

In one preferable embodiment of the invention, the recording layer having a multilayer structure includes an upper layer containing the copolymer (A) containing a structural unit derived from (meth)acrylonitrile and a structural unit derived from styrene, and a lower layer containing the water-insoluble and alkali-soluble resin (B) and the infrared absorbing agent (C).

In the positive-working recording layer having a multilayer structure, in a non-exposed area (that is, an image area), the upper layer protects the lower layer from a developer. The upper layer is insoluble in an alkaline developer before image formation (that is, before being image-wise exposed). However, an area of the upper layer that has been exposed becomes removable by a developer after image-wise exposure. While not being bound to any theory or explanation, it is believed that due to image-wise exposure the upper layer more easily dissolves or disperses in a developer and/or the adhesion between the upper layer and the lower layer is weakened. This enables the developer to penetrate through the upper layer into the lower layer to dissolve the lower layer, and the surface of the substrate appears.

It is preferable that the water-insoluble and alkali-soluble resin (B) and the infrared absorbing agent (C) are contained in the lower layer. After image formation, the lower layer is removed together with the upper layer in an imaged area by the aqueous alkaline solution, thereby exposing the substrate underneath. In order to prevent the generation of scum in a developer, the lower layer is preferably soluble in the aqueous alkaline solution.

(A) Copolymer Containing Structural Unit Derived from (Meth)Acrylonitrile and Structural Unit Derived from Styrene In the invention, the recording layer contains a copolymer (A) containing a structural unit derived from (meth)acrylonitrile and a structural unit derived from styrene (hereinafter may be referred to as a "specific copolymer (A)").

When the positive-working recording layer has a multilayer structure including a upper layer and a lower layer, it is preferable that the upper layer contains the specific copolymer (A).

The specific copolymer (A) may be insoluble in the aqueous alkaline solution. It is thought that, in a case when the upper layer includes the specific polymer (A) that is insoluble in an aqueous alkaline solution, in exposed areas a developer penetrates through the upper layer to dissolve or disperse the lower layer in these areas, and the upper layer and the lower layer are removed and dispersed in the developer.

From the viewpoint of suppressing the generation of development scum, the (meth)acrylonitrile as the structural unit derived from (meth)acrylonitrile is preferably acrylonitrile.

The styrene as the structural unit derived from styrene may be an unsubstituted styrene or a styrene derivative having at least one substituent. Examples of the substituent include a halogen atom (such as a F atom, a Cl atom, a Br atom, or an I atom), and an alkyl group having 1 to 10 carbon atoms.

Specific examples of the substituted or unsubstituted styrene include styrene, o-methylstyrene, m-methylstyrene, p-methylstyrene, p-methoxystyrene, p-phenylstyrene, p-chlorostyrene, p-ethylstyrene, p-n-butylstyrene, p-tert-butylstyrene, p-n-hexylstyrene, p-n-octylstyrene, p-n-nonylstyrene, p-n-decylstyrene, p-n-dodecylstyrene, 2,4-dimethylstyrene, and 3,4-dichlorostyrene. Among these, styrene is preferable.

In addition to the structural unit derived from (meth)acrylonitrile or styrene, the specific copolymer (A) may include a structural unit derived from a third monomer. The third monomer is preferably an ethylenically unsaturated monomer having an alkali-soluble group. Examples of the ethylenically unsaturated monomer having an alkali-soluble group include acrylic acid and methacrylic acid, and compounds represented by the following formulae and mixtures thereof. In the following formulae, R represents a hydrogen atom or a methyl group. In the following formulae, —OH, —SO$_2$NH$_2$, or —COOH bonded to a phenyl group may be bonded to any position of the phenyl group.

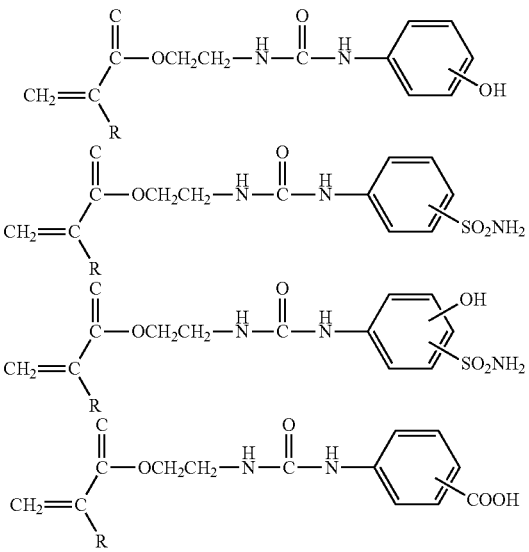

The third monomer is preferably (meth)acrylic acid, and more preferably methacrylic acid.

From the viewpoint of suppressing the generation of development scum, the proportion of the structural unit derived from (meth)acrylonitrile in the specific copolymer (A) is preferably from 10% by mole to 40% by mole, more preferably from 15% by mole to 35% by mole, and still more preferably from 20% by mole to 30% by mole.

From the viewpoint of inking properties, the proportion of the structural unit derived from styrene in the specific copolymer (A) is preferably from 55% by mole to 85% by mole, more preferably from 60% by mole to 80% by mole, and still more preferably from 65% by mole to 75% by mole.

The proportion of the structural unit derived from the third monomer in the specific copolymer (A) is preferably 15% by mole or less, more preferably 10% by mole or less, and still more preferably 6% by mole or less.

The weight-average molecular weight of the specific copolymer (A) is preferably from 1,000 to 1,000,000, more preferably from 3,000 to 300,000, and still more preferably from 10,000 to 50,000.

The content of the specific copolymer (A) in the recoding layer is preferably from 5% by mass to 70% by mass, more preferably from 20% by mass to 55% by mass, and still more preferably from 35% by mass to 45% by mass, with respect to a total mass of a solid content of the recording layer excluding a volatile component.

When the recording layer has a multilayer structure, it is preferable that the upper layer contains the specific copolymer (A). The content of the specific copolymer (A) in the upper layer is preferably from 10% by mass to 80% by mass, more preferably from 40% by mass to 75% by mass, and still more preferably from 60% by mass to 70% by mass, with respect to a total mass of a solid content of the upper layer excluding a volatile component.

When the recording layer has a multilayer structure, another resin may be added to the upper layer in addition to the specific copolymer (A), and examples of the another resin include a (meth)acrylic polymer and a copolymer thereof; polystyrene; a styrene/acryl copolymer; polyester; polyamide; polyurea; polyurethane; nitrocellulose; epoxy resin; and a mixture thereof.

(B) Water-Insoluble and Alkali-Soluble Resin

In the invention, the recording layer contains (B) a water-insoluble and alkali-soluble resin (hereinafter may be referred to as "alkali-soluble resin (B)"). The alkali-soluble resin (B) does not include any polymer corresponding to the specific copolymer (A).

With respect to the alkali-soluble resin (B), the expression "water-insoluble" as used herein means that when the resin dissolved in an appropriate solvent is applied onto the substrate and dried to form a film, reduction in the film thickness of the film is not observed when immersed in an aqueous solution having a temperature of 25° C. to 35° C. and a pH of from 6 to 8 for 30 seconds and washed with running water. The expression "alkali-soluble" means a state in which, when a film formed in the same manner as above is immersed in an aqueous alkaline solution having a temperature of 25° C. to 35° C. and a pH of from 8.5 to 10.8 for 60 seconds and then washed with running water, the coating film is removed by dissolution and the substrate is exposed.

When the recording layer has a multilayer structure including a upper layer and a lower layer, the alkali-soluble resin (B) may be contained in either the upper layer or the lower layer, but is preferably contained only in the lower layer.

The alkali-soluble resin (B) is preferably an alkali-soluble acrylic resin. As the alkali-soluble acrylic resin, a polymer formed by polymerization of monomers containing at least one ethylenically unsaturated monomer having an acidic group or a mixture of such monomer is preferably used.

Examples of the ethylenically unsaturated monomer having an acidic group include an ethylenically unsaturated monomer having an alkali-soluble group such as that mentioned as the third monomer in the specific copolymer (A). Among these, (meth)acrylic acid is preferable, and methacrylic acid is more preferable.

Since it has an excellent developability, the content of the ethylenically unsaturated monomer having an acidic group that imparts alkali solubility is preferably from 1% by mole to 30% by mole, more preferably from 5% by mole to 25% by mole, and still more preferably from 10% by mole to 20% by mole, when the total content of the structural units included in the alkali-soluble resin (B) is assumed to be 100% by mole.

Examples of monomers other than the ethylenically unsaturated monomer having an acidic group include an alkyl (meth)acrylate, a (meth)acrylic acid ester having an aliphatic hydroxy group, (meth)acrylamide, a vinyl ester, a styrene compound, a nitrogen atom-containing monomer such as N-vinylpyrrolidone, and a maleimide compound. Among these monomers, a (meth)acrylic acid ester, (meth)acrylamide, a maleimide compound, and (meth)acrylonitrile are preferable, and (meth)acrylamides and maleimides are more preferable.

Preferable examples of the maleimide compound include N-substituted maleimide compounds, and specific examples thereof include N-methylmaleimide, N-ethylmaleimide, N-n-propylmaleimide, N-i-propylmaleimide, N-n-butylmaleimide, N-t-butylmaleimide, N-n-hexylmaleimide, N-cyclopentylmaleimide, N-cyclohexylmaleimide, N-phenylmaleimide, and N-1-naphthylmaleimide. Among these, N-cyclohexylmaleimide and N-phenylmaleimide are preferable, and N-phenylmaleimide is more preferable. The N-substituted maleimide compounds may be used singly or in combination of two or more kinds thereof.

The content of the structural unit derived from the N-substituted maleimide compound in the alkali-soluble resin (B) is preferably 75% by mole or less, more preferably from 45% by mole to 75% by mole, and still more preferably from 50 to 70% by mole, when the total content of the structural units included in the alkali-soluble resin (B) is assumed to be 100% by mole.

It is preferable that the alkali-soluble resin (B) includes a structural unit derived from (meth)acrylamide, and the content thereof in the alkali-soluble resin (B) is preferably 40% by mole or less, more preferably from 10% by mole to 40% by mole, and still more preferably from 20% by mole to 30% by mole, when the total content of the structural units included in the alkali-soluble resin (B) is assumed to be 100% by mole.

The weight-average molecular weight of the alkali-soluble resin (B) is preferably 2,000 or more, more preferably from 10,000 to 100,000, and still more preferably from 30,000 to 60,000. The number average molecular weight of the alkali-soluble resin (B) is preferably from 500 to 250,000. The degree of dispersion (weight average molecular weight/number average molecular weight) of the alkali-soluble resin (B) is preferably from 1.1 to 10.

The content of the alkali-soluble resin (B) in the recording layer is preferably from 30% by mass to 60% by mass, more preferably from 35% by mass to 55% by mass, and still more preferably from 40% by mass to 50% by mass, with respect to a total mass of a solid content of the recording layer excluding a volatile component.

When the recording layer has a multilayer structure, it is preferable that the alkali-soluble resin (B) is added to the lower layer; and the content of the alkali-soluble resin (B) in the lower layer is preferably from 20% by mass to 98% by mass, more preferably from 60% by mass to 98% by mass, and still more preferably from 80% by mass to 98% by mass, with respect to a total mass of a solid content of the lower layer excluding a volatile component.

Second Alkali-Soluble Resin

It is preferable that the recording layer includes a second alkali-soluble resin in addition to the alkali-soluble resin (B). In Particular, when the recording layer has a multilayer structure including an upper layer and a lower layer, it is preferable that the upper layer includes the second alkali-soluble resin.

Examples of the second alkali-soluble resin include an alkali-soluble polyurethane resin, an alkali-soluble phenol resin, an alkali-soluble resin having a urea bond in a side chain thereof, an alkali-soluble polyamide resin, an alkali-soluble epoxy resin, an alkali-soluble polyacetal resin, and an alkali-soluble polystyrene-based resin.

The alkali-soluble polyurethane resin is preferably a polyurethane resin having a carboxy group in the polymer main chain, and specific examples thereof include a polyurethane resin having, as a basic skeleton, a reaction product between a diisocyanate compound represented by Formula (1) below and a carboxy group-containing diol compound represented by Formula (2) or Formula (3) below.

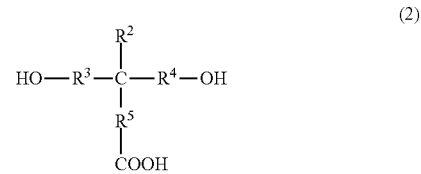

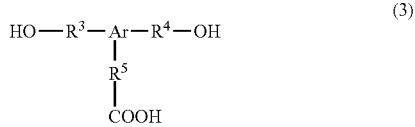

In Formula (1), $R^1$ represents a divalent hydrocarbon group. Preferable examples of $R^1$ include an alkylene group having 2 to 10 carbon atoms and an arylene group having 6 to 30 carbon atoms. $R^1$ may have, as a substituent, another functional group that does not react with an isocyanate group.

In Formula (2), $R^2$ represents a hydrogen atom or a hydrocarbon group. Preferable examples of $R^2$ include a hydrogen atom, an unsubstituted alkyl group having 1 to 8 carbon atoms, and an unsubstituted aryl group having 6 to 15 carbon atoms.

In Formulae (2) and (3), $R^3$, $R^4$, and $R^5$ each independently represent a single bond or a divalent linking group. Examples of the divalent linking group include an aliphatic hydrocarbon group and an aromatic hydrocarbon group; an unsubstituted alkylene group having 1 to 20 carbon atoms and an unsubstituted arylene group having 6 to 15 carbon atoms are preferable, and an unsubstituted alkylene group having 1 to 8 carbon atoms is more preferable.

In Formula (3), Ar represents a trivalent aromatic hydrocarbon group, and preferably represents a trivalent aromatic hydrocarbon group having 6 to 15 carbon atoms.

$R^1$ to $R^5$ and Ar may have a substituent that does not react with the isocyanate group.

Specific examples of the diisocyanate compound represented by Formula (1) include aromatic diisocyanate compounds such as 2,4-tolylene diisocyanate, 2,4-tolylene diisocyanate dimer, 2,6-tolylene diisocyanate, p-xylylene diisocyanate, meta-xylylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and a dimeric acid diisocyanate; alicyclic diisocyanate compounds such as isophorone diisocyanate, 4,4'-methylenebis(cyclohexyl isocyanate), methylcyclohexane-2,4-diisocyanate, methylcyclohexane-2,6-)-diisocyanate, and 1,3-(isocyanatomethyl)cyclohexane; and diisocyanate compounds that are products of a reaction between diol and diisocyanate, such as an adduct of 1 mol of 1,3-butylene glycol and 2 mol of tolylene diisocyanate. Among these, one having an aromatic ring, such as 4,4'-diphenylmethane diisocyanate, xylylene diisocyanate, or tolylene diisocyanate is preferable from the viewpoint of scratch resistance.

Specific examples of the carboxy group-containing diol compound represented by Formula (2) or (3) include 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl)acetic acid, bis(4-hydroxyphenyl)acetic acid, 4,4-bis(4-hydroxyphenyl) pentanoic acid, and tartaric acid. Among these, 2,2-bis(hydroxymethyl)propionic acid and 2,2-bis(hydroxyethyl)propionic acid are preferable from the viewpoint of reactivity with an isocyanate.

The alkali-soluble polyurethane resin may be synthesized by heating the above-mentioned diisocyanate compound and diol compound in an aprotic solvent with added thereto a known catalyst having activity required for the reactivities thereof.

The mole ratio (diisocyanate compound:diol compound) of the diisocyanate compound and the diol compound used is preferably 0.8:1 to 1.2:1. When the isocyanate group remains on the terminus of the polymer, by treating it with an alcohol, an amine, or the like, the polymer can be finally synthesized in a form in which there are no remaining isocyanate groups.

The weight-average molecular weight of the alkali-soluble polyurethane resin is preferably 1,000 or more, and more preferably from 5,000 to 100,000. These alkali-soluble polyurethane resins may be used in combination of two or more kinds thereof.

Preferable examples of the alkali-soluble phenol resin include an alkali-soluble novolac resin, and specific examples thereof include alkali-soluble novolac resins such as a phenol formaldehyde novolac resin, a m-cresol formaldehyde novolac resin, a p-cresol formaldehyde novolac resin, a mixed m-/p-cresol formaldehyde novolac resin, and a mixed phenol/cresol (any of m-, p-, or mixed m-/p-) formaldehyde novolac resin. For example, a condensate of formaldehyde and a phenol having an alkyl group having as a substituent 3 to 8 carbon atoms, such as a t-butylphenol formaldehyde resin or an octylphenol formaldehyde resin, may be used in combination.

The weight-average molecular weight of the alkali-soluble phenol resin is preferably from 500 to 20,000, more preferably from 1,000 to 10,000, and still more preferably from 2,000 to 8,000.

The alkali-soluble resin having a urea bond in a side chain thereof is preferably a polymer including a structural unit derived from a urea bond-containing acrylic monomer having a phenolic hydroxy group as a substituent, and examples thereof include a polymer including a structural unit derived from a compound represented by the following Formula (4).

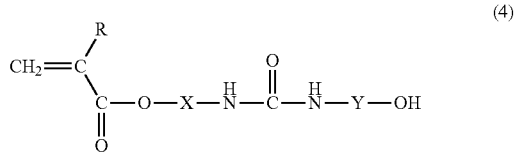

In Formula (4), R represents a hydrogen atom or an alkyl group.

X represents a divalent linking group, such as an alkylene group or a phenylene group. X is preferably an alkylene group, more preferably a straight-chain or branched alkylene group having 1 to 10 carbon atoms, and still more preferably an alkylene group having 1 to 4 carbon atoms.

Y represents a divalent aromatic group optionally having a substituent, and examples thereof include a phenylene or naphthylene group optionally having a substituent. Examples of the substituent include an alkyl group having 1 to 3 carbon atoms and an aryl group having 6 to 20 carbon atoms.

From the viewpoint of development latitude, the content of the structural unit derived from the compound represented by Formula (4) in the alkali-soluble resin having a urea bond in a side chain thereof is preferably from 10% by mole to 80% by mole, and more preferably from 15% by mole to 70% by mole, and still more preferably from 20% by mole to 60% by mole, when the content of all monomer units of the alkali-soluble resin having a urea bond in a side chain thereof is assumed to be 100% by mole.

The polymer including a structural unit derived from the urea bond-containing acrylic monomer having a phenolic hydroxy group as a substituent is preferably a copolymer including a structural unit derived from a compound that has a polymerizable unsaturated bond and does not contain a urea bond. The copolymer is preferably formed by copolymerization using a polymerizable monomer that does not contain a urea bond at from 10% by mole to 80% by mole, when the total content of structural units in the copolymer is assumed to be 100% by mole.

Preferable examples of the monomer containing no urea bond include an N-phenylmaleimide derivative or a (meth) acrylic monomer having a sulfonamide group in a side chain thereof. Examples of the N-phenylmaleimide derivative include N-phenylmaleimide, N-2-methylphenylmaleimide, N-2,6-diethylphenylmaleimide, N-2-chlorophenylmaleimide, and N-hydroxyphenylmaleimide.

Examples of the (meth)acrylic monomer having a sulfonamide group in a side chain thereof include m-aminosulfonylphenyl (meth)acrylate, N-(p-aminosulfonylphenyl) (meth)acrylamide, and N-(p-aminosulfonylphenyl)(meth) acrylamide.

The weight average molecular weight of the alkali-soluble resin having a urea bond in a side chain thereof is preferably 2,000 or more, and more preferably from 3,000 to 500,000, and the number-average molecular weight thereof is preferably 1,000 or more, and more preferably from 2,000 to 400,000.

When the recording layer has a multilayer structure, the second alkali-soluble resin is preferably added to the upper layer. As the second alkali-soluble resin added to the upper layer, an alkali-soluble polyurethane resin and an alkali-soluble phenol resin are preferable, and an alkali-soluble polyurethane resin is more preferable.

The content of the second alkali-soluble resin in the recording layer is preferably 40% by mass or less, more preferably from 10% by mass to 35% by mass, and still more preferably from 15% by mass to 30% by mass, with respect to a total mass of a solid content of the recording layer excluding a volatile component.

When the recording layer has a multilayer structure, the second alkali-soluble resin is preferably added to the upper layer, and the content of the second alkali-soluble resin in the upper layer is preferably 50% by mass or less, more preferably from 15% by mass to 45% by mass, and still more preferably from 20% by mass to 40% by mass, with respect to a total mass of a solid content of the upper layer excluding a volatile component.

(C) Infrared Absorbing Agent

In the invention, the recording layer includes (C) an infrared absorbing agent. When the recording layer has a multilayer structure, the infrared absorbing agent is preferably added to the lower layer and may also be added to the upper layer. As the infrared absorbing agent, any of various dyes known as infrared absorbing agents may be used.

As the infrared absorbing agent, known infrared absorbing agents may be used, and specific examples thereof include dyes such as azo dyes, metal complex salt azo dyes, pyrazolone azo dyes, anthraquinone dyes, phthalocyanine dyes, carbonium dyes, quinoneimine dyes, methine dyes, and cyanine dyes. In the invention, among these dyes, dyes absorbing infrared light or near-infrared light are preferable since it is suitable for utilization with a laser that emits infrared or near-infrared light, and cyanine dyes are more preferable.

Examples of the dye that absorbs at least infrared or near-infrared light include cyanine dyes such as those described in JP-A No. 58-125246, JP-A No. 59-84356, JP-A No. 59-202829, and JP-A No. 60-78787, methine dyes such as those described in JP-A No. 58-173696, JP-A No. 58-181690, and JP-A No. 58-194595, naphthoquinone dyes such as those described in JP-A No. 58-112793, JP-A No. 58-224793, JP-A No. 59-48187, JP-A No. 59-73996, JP-A No. 60-52940, and JP-A No. 60-63744, squarylium dyes such as those described in JP-A No. 58-112792, and cyanine dyes such as those described in GB Patent No. 434,875B.

Preferable examples of the dye include near-infrared absorbing sensitizers such as those as described in U.S. Pat. No. 5,156,938. Preferable examples of the dye also include substituted arylbenzo(thio)pyrylium salts such as those described in U.S. Pat. No. 3,881,924, trimethine thiapyrylium salts such as those described in JP-A No. 57-142645 (corresponding to U.S. Pat. No. 4,327,169), pyrylium compounds such as those described in JP-A No. 58-181051, JP-A No. 58-220143, JP-A No. 59-41363, JP-A No. 59-84248, JP-A No. 59-84249, JP-A No. 59-146063, and JP-A No. 59-146061, cyanine dyes such as those describes in JP-A No. 59-216146, pentamethinethiopyrylium salts such as those described in U.S. Pat. No. 4,283,475, and pyrylium compounds such as those disclosed in JP-A No. 05-13514 or 05-19702; and commercially-available dyes such as EPOLIGHT III-178, EPOLIGHT 111-130, and EPOLIGHT 111-125 (trade names, manufactured by Epolin Inc.).

Preferable examples of the dye also include near-infrared absorbing dyes such as those represented by Formulae (I) and (II) of U.S. Pat. No. 4,756,993.

Among these dyes, cyanine dyes, phthalocyanine dyes, oxonol dyes, squarylium dyes, pyrylium salts, thiopyrylium dyes, and nickel thiolate complexes are preferable. In particular, a cyanine dye represented by the following Formula (a) is preferable, in terms of good interactivity with alkali-soluble resins, sensitivity and economic efficiency.

Formula (a)

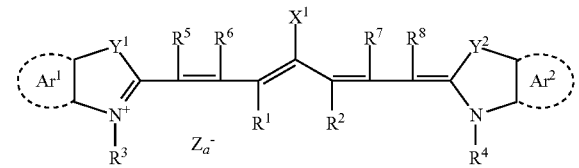

In Formula (a), $X^1$ represents a hydrogen atom, a halogen atom, —$NPh_2$, $X^2$-$L^1$ or a group represented by the following formula, in which $X^2$ represents an oxygen atom or a sulfur atom, and $L^1$ represents a hydrocarbon group having 1 to 12 carbon atoms, an aromatic ring having a hetero atom, or a hydrocarbon group which has 1 to 12 carbon atoms and contains a hetero atom. Here, examples of the hetero atom include N, S, O, a halogen atom, and Se.

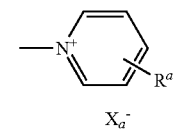

In the above structural formula, $X_a^-$ has the same definition as $Z_a^-$ described below, and $R^a$ represents a substituent selected from the group consisting of a hydrogen atom, an alkyl group, an aryl group, a substituted or unsubstituted amino group, and a halogen atom.

In Formula (a), $R^1$ and $R^2$ independently represent a hydrocarbon group having 1 to 12 carbon atoms. From the viewpoint of the preservation stability of a recording layer coating solution, it is preferable that $R^1$ and $R^2$ each represent a hydrocarbon group having two or more carbon atoms, and it is more preferable that $R^1$ and $R^2$ are linked to each other to form a 5-membered ring or a 6-membered ring.

In Formula (a), $Ar^1$ and $Ar^2$ may be the same as or different from each other, and independently represent an aromatic hydrocarbon group optionally having a substituent. Preferable examples of the aromatic hydrocarbon group include a benzene ring and naphthalene ring. Preferable examples of the optional substituent include a hydrocarbon group having 12 or less carbon atoms, a halogen atom, and an alkoxy group having 12 or less carbon atoms.

In Formula (a), $Y^1$ and $Y^2$ may be the same as or different from each other, and independently represent a sulfur atom or a dialkylmethylene group having 12 or less carbon atoms; $R^3$ and $R^4$ may be the same as or different from each other, and independently represent a hydrocarbon group having 20 or less carbon atoms and optionally having a substituent. Preferable examples of the optional substituent include an alkoxy group having 12 or less carbon atoms, a carboxy group, and a sulfo group.

In Formula (a), $R^5$, $R^6$, $R^7$ and $R^8$ may be the same as or different from one another, and independently represent a hydrogen atom, or a hydrocarbon group having 12 or less carbon atoms. From the viewpoint of the availability of the raw material, a hydrogen atom is preferable. In Formula (a), $Za^-$ represents a counter anion. It should be noted that, when a cyanine dye represented by Formula (a) has an anionic substituent in the structure thereof and it is not necessary to neutralize the electric charge thereof, $Za^-$ is not needed (i.e., $Za^-$ may not be present). From the viewpoint of preservation stability of a recording layer coating solution, examples of $Za^-$ is preferably a halogen ion, a perchlorate ion, a tetrafluoro borate ion, a hexafluoro phosphate ion, or a sulfonate ion, and more preferably a perchlorate ion, a hexafluoro phosphate ion, or an aryl sulfonate ion.

Specific examples of the cyanine dye represented by Formula (a) which may be suitably used in the invention include cyanine dye A exemplified below; and cyanine dye such as those described in paragraphs [0017] to [0019] of JP-A No. 2001-133969, in paragraphs [0012] to [0038] of JP-A No. 2002-40638, and in paragraphs [0012] to [0023] of JP-A No. 2002-23360.

Cyanine dye A

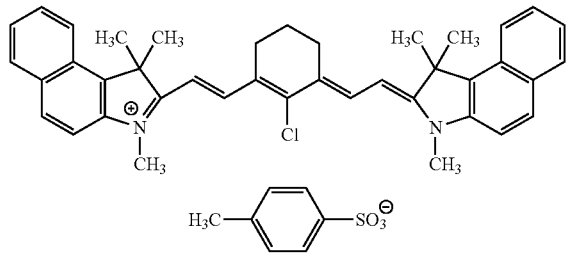

The content of infrared absorbing agent is preferably from 0.01% by mass to 50% by mass, more preferably from 0.1% by mass to 30% by mass, and still more preferably from 1.0% by mass to 30% by mass, with respect to a total solid content of a recording layer.

When the recording layer has a multilayer structure including a upper layer and a lower layer, the content of infrared absorbing agent in the lower layer is preferably from 0.01% by mass to 50% by mass, more preferably from 0.1% by mass to 30% by mass, and still more preferably from 1.0% by mass to 30% by mass, with respect to a total solid content of the lower layer.

Other Additives

The recording layer may further contain a variety of additives other than the above-mentioned components as required, as long as the effects of the invention are not impaired. When the recording layer has a multilayer structure including a upper layer and a lower layer, the additives may be added only to the lower layer, only to the upper layer, or to both layers.

Development Accelerator

For the purpose of improving sensitivity, the recording layer may contains at least one selected from the group consisting of acid anhydrides, phenols, and organic acids.

Preferable examples of the acid anhydrides include cyclic acid anhydrides, and specific examples the cyclic acid anhydrides, described in U.S. Pat. No. 4,115,128, include phthalic anhydride, tetrahydrophthalic anhydride, hexahydrophthalic anhydride, 3,6-endoxy tetrahydrophthalic anhydride, tetrachlorophthalic anhydride, maleic anhydride, chloromaleic anhydride, α-phenylmaleic anhydride, succinic anhydride, and pyromellitic dianhydride. Examples of non-cyclic acid anhydrides include acetic anhydride.

Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acids include those described in JP-A No. 60-88942 and JP-A No. 02-96755, and specific examples thereof include p-toluenesulfonic acid, dodecyl benzene sulfonic acid, p-toluenesulfinic acid, ethyl sulfuric acid, phenyl phosphonic acid, phenyl phosphinic acid, phenyl phosphoric acid, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The proportion of the acid anhydrides, phenols and organic acids is preferably from 0.05% by mass to 20% by mass, more preferably from 0.1% by mass to 15% by mass, and still more preferably from 0.1% by mass to 10% by mass, with respect to a total solid content of the recording layer (the lower or upper layer when the recording layer has a multilayer structure).

Surfactant

For the purpose of improving coating properties and/or enhancing stability to treatment under development conditions, the recording layer may further contain a non-ionic surfactant described in JP-A No. 62-251740 or JP-A No. 03-208514, an amphoteric surfactant described in JP-A No. 59-121044 or JP-A No. 04-13149, or a copolymer of a fluorine-containing monomer described in JP-A No. 62-170950, JP-A No. 11-288093, or JP-A No. 2003-57820.

Specific examples of the non-ionic surfactant include sorbitan tristearate, sorbitan monopalmitate, sorbitan triolate, stearic acid monoglyceride, and polyoxyethylene nonyl phenyl ether.

Specific examples of the amphoteric surfactant include an alkyl di(aminoethyl)glycine, an alkyl polyaminoethyl glycine hydrochloride, an 2-alkyl-N-carboxyethyl-N-hydroxyethyl imidazolinium betaine, and N-tetradecyl-N,N-betaine (for example, trade name: "AMOGEN K", manufactured by Dai-ichi Kogyo Seiyaku Co., Ltd.).

The proportion (total content) of the surfactant in the recording layer (the lower or upper layer when the recording layer has a multilayer structure) is preferably from 0.01% by mass to 15% by mass, more preferably from 0.01% by mass to 5% by mass, and still more preferably from 0.05% by mass to 2.0% by mass, with respect to a total solid content of the recording layer (the lower or upper layer when the recording layer has a multilayer structure).

Printing-Out Agent and Colorant

The recording layer may further contain a printing-out agent to immediately form a visible image after the heating caused by exposure, and/or a dye or pigment for coloring images. Typical examples of the printing-out agent include a combination of a compound (photo-acid generator) which releases an acid as a result of the heating caused by exposure and an organic dye which can form a salt with the photo-acid generator. Specific examples of the photo-acid generator include an o-naphthoquinonediazide-4-sulfonic acid halogenide, and oxazole compounds such as a triazine compound and a trihalomethyl compound.

In addition to the organic dye which can form a salt with the compound, another known dye may be used as the colorant. Preferable examples of the colorant include oil-soluble dyes and basic dyes, and specific examples thereof include Oil Yellow #101, Oil Yellow #103, Oil Pink #312, Oil Green BG, Oil Blue BOS, Oil Blue #603, Oil Black BY, Oil Black BS, and Oil Black T-505 (these products are manufactured by Orient Chemical Industries, Ltd.), Victoria Pure Blue, Crystal Violet lactone, Crystal Violet (CI42555), Methyl Violet (CI42535), Ethyl Violet, Rhodamine B (CI145170B), Malachite Green (CI42000), Methylene Blue (CI52015), and dyes such as those described in JP-A No. 62-293247.

The content of these dyes in the recording layer (the lower or upper layer when the recording layer has a multilayer structure) is preferably from 0.01% by mass to 10% by mass, more preferably from 0.1% by mass to 3% by mass, with respect to a total solid content of the recording layer (the lower or upper layer when the recording layer has a multilayer structure)

Plasticizer

To the recording layer, a plasticizer may be added in order to impart flexibility or the like to a coating film. Examples thereof include butyl phthalyl, polyethylene glycol, tributyl citrate, diethyl phthalate, dibutyl phthalate, dihexyl phthalate, dioctyl phthalate, tricresyl phosphoric acid, tributyl phosphoric acid, trioctyl phosphoric acid, tetrahydrofurfuryl oleate, and oligomers and polymers of acrylic acid or methacrylic acid.

The proportion (total content) of the plasticizer in the recording layer (the lower or upper layer when the recording layer has a multilayer structure) is preferably from 0.5% by mass to 10% by mass, and more preferably from 1.0% by mass to 5% by mass, with respect to a total solid content of the recording layer (the lower or upper layer when the recording layer has a multilayer structure)

Wax Agent

For the purpose of imparting resistance to scratching, a compound that reduce the coefficient of static friction of the surface may be added to the recording layer (the upper layer when the recording layer has a multilayer structure). Specific examples thereof include compounds including esters of long chain alkylcarboxylic acids, such as those described in U.S. Pat. No. 6,117,913, JP-A No. 2003-149799, JP-A No. 2003-302750 and JP-A No. 2004-12770.

The proportion (total content) of the wax agent in the recording layer (the upper layer when the recording layer has a multilayer structure) is preferably from 0.1% by mass to 10% by mass, and more preferably from 0.5% by mass to 5% by mass.

Formation of Recording Layer

The recording layer of the planographic printing plate precursor of the invention may be suitably formed by dissolving each of the above-mentioned components in a solvent and coating an appropriate substrate therewith.

Examples of the solvent which may be used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone and toluene, but not limited thereto. These solvents may be used singly or in a combination of two or more kinds thereof When the recording layer has a multilayer structure including an upper layer and an lower layer, the lower layer and the upper layer are in principle preferably formed as two separate layers.

Examples of a method for forming two separate layers include a method in which a difference in solvent solubility between components contained in the lower layer and components contained in the upper layer is utilized; and a method in which, after an upper layer is applied, the solvent is rapidly removed by drying. These methods are described in detail below, but the method for coating as two separate layers is not limited to these methods.

As the method in which a difference in solvent solubility between components contained in the lower layer and components contained in the upper layer is utilized, a solvent system in which all of the components contained in the lower layer are insoluble is used when applying an upper layer coating solution. This enables each layer to be formed in a clearly separated manner even when carrying out two-layer coating.

For example, as a solvent for the upper layer, 3-pentanone or propylene glycol monobutylether-2-acetate which dissolves an alkali-soluble resin, an upper layer component, and does not dissolve a component of a lower layer is selected; and as a solvent for the lower layer, a solvent system which includes as a main solvent γ-butyrolactone which dissolve a component of the lower layer is selected. Two layers may be formed by coating and drying these solvents, then dissolving an upper layer component mainly containing an alkali-soluble resin by 3-pentanone, propylene glycol monomethylether-2-acetate, or the like, and drying the resultant.

The method of drying a solvent extremely rapidly after application of a second layer (i.e., an upper layer) may be performed by blowing a high-pressure air through a slit nozzle provided in the direction approximately perpendicular to the running direction of a web, applying a heat energy as a conductive heat to a web from the under surface of the web using a roll (heating roll) in which a heating medium such as steam is provided, or by a combination of these methods.

In order to impart a new function, the upper layer and the lower layer may proactively be made partially miscible in a range in which the effects of the invention are sufficiently exhibited. As a method for carrying out the above, in the method utilizing a difference in solvent solubility and in the method in which the solvent is very rapidly dried after coating with a second layer, it may be carried out by adjusting the extent of the difference in solvent solubility or the extent of the rapid drying.

The concentration of the components, excluding solvent (the total solid content including additives), in a recording layer coating solution (lower layer/upper layer coating solution when the recording layer has a multilayer structure) with which a support is coated is preferably from 1% by mass to 50% by mass.

As a method for applying a recording layer coating solution, various methods may be used, and examples thereof include bar coater coating, spin coating, spray coating, curtain coating, dip coating, air knife coating, blade coating, and roll coating.

In particular, the upper layer coating method is preferably a non-contact method since it can prevent damage to the lower layer when applying the upper layer. Furthermore, although it is a contact method, it is possible to use bar coater coating as a method that is normally used for solvent system coating, and it is preferable to carry out coating in direct roll drive mode in order to prevent damage to the lower layer.

When the recording layer has a single layer structure, the dry coat weight of the record layer component applied onto the substrate of the lithographic printing plate precursor is preferably in the range of 0.5 g/m$^2$ to 4.0 g/m$^2$, and more preferably in the range of 0.5 g/m$^2$ to 3.0 g/m$^2$.

When the recording layer has a multilayer structure, the dry coat weight of the lower layer component applied onto the substrate of the lithographic printing plate precursor is preferably in the range of from 0.5 g/m$^2$ to 4.0 g/m$^2$, and more preferably in the range of from 0.6 g/m$^2$ to 2.5 g/m$^2$. When it is 0.5 g/m$^2$ or more, printing durability is excellent, and when it is 4.0 g/m$^2$ or less, image reproduction properties and sensitivity are excellent.

The dry coat weight of the upper layer component is preferably in the range of from 0.05 g/m$^2$ to 1.0 g/m$^2$, and more preferably in the range of from 0.08 g/m$^2$ to 0.7 g/m$^2$. When it is 0.05 g/m$^2$ or more, the development latitude and scratch resistance are excellent, and when it is 1.0 g/m$^2$ or less, the sensitivity is excellent.

The dry coat weight of the lower layer and the upper layer in total is preferably in the range of from 0.6 g/m$^2$ to 4.0 g/m$^2$, and more preferably in the range of 0.7 g/m$^2$ to 2.5 g/m$^2$. When it is 0.6 g/m$^2$ or more, the printing durability is excellent, and when it is 4.0 g/m$^2$ or less, the image reproduction properties and the sensitivity are excellent.

Substrate

The substrate is not particularly limited as long as it is a plate-shaped material having required strength and durability, and dimensional stability, and examples thereof include paper, paper laminated with a plastic (e.g. polyethylene, polypropylene, polystyrene, etc.), a metal plate (e.g. aluminum, zinc, copper, etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or plastic film laminated or vapor-deposited with the above-mentioned metal.

Among these, in the invention, a polyester film and an aluminum plat are preferable, and an aluminum plate, which has a good dimension stability and is relatively inexpensive, is more preferable. Examples of a suitable aluminum plate include a pure aluminum plate, and an alloy plate containing aluminum as a main component and a trace amount of another element; and a plastic film laminated or vapor-deposited with aluminum. Examples of other elements which may be contained in the aluminum alloy include silicon, iron, manganese, copper, magnesium, chromium, zinc, bismuth, nickel, and titanium. The content of other elements in the alloy is preferably 10% by mass or less.

A particularly preferable aluminum in the invention is pure aluminum, but since it is difficult to produce a completely pure aluminum in terms of refining techniques, it may contain a trace amount of another element.

Such an aluminum plate applied to the invention is not specified in terms of composition, and an aluminum plate formed from a conventionally known, widely used material may appropriately be used. The aluminum plate used in the invention preferably has a thickness of from 0.1 mm to 0.6 mm, more preferably from 0.15 mm to 0.4 mm, and still more preferably from 0.2 mm to 0.3 mm.

Such an aluminum plate may be subjected if necessary to a surface treatment such as a surface roughening treatment or an anodizing process. These surface treatments are briefly explained below.

Prior to roughening the surface of the aluminum plate, if desired, a degreasing treatment with, for example, a surfactant, an organic solvent, or an aqueous alkaline solution is carried out in order to remove rolling oil from the surface. The treatment to roughen the surface of the aluminum plate may be carried out by various methods such as, for example, a method involving mechanical roughening, a method involving electrochemical dissolution-roughening of the surface, and a method involving selective chemical dissolution of the surface. As the mechanical method, a known method such as a ball grinding method, a brush grinding method, a blast grinding method, or a buff grinding method can be employed. With regard to the electrochemical roughening method, there is a method in which alternating current or direct current is used in a hydrochloric acid or nitric acid electrolytic solution. As disclosed in JP-A-54-63902, a method in which the two methods are combined can also be employed.

The aluminum plate whose surface has been roughened is optionally subjected to an alkali etching treatment and a neutralizing treatment if necessary, and then, if desired, to an anodizing treatment in order to improve the water retention and the abrasion resistance of the surface. As the electrolyte used for the anodizing treatment of the aluminum plate, various electrolytes for forming a porous anodized film can be used, and in general, sulfuric acid, phosphoric acid, oxalic acid, chromic acid, or a mixture of these acids is used. The concentration of the electrolyte is determined appropriately according to the type of the electrolyte.

The conditions for anodizing treatment depend on the type of electrolyte used and cannot, as a rule, be fixed but in general an electrolyte concentration of from 1% by mass to 80% by mass, a solution temperature of from 5° C. to 70° C., a current density of from 5 A/dm$^2$ to 60 A/dm$^2$, a voltage of from 1 V to 100 V, and an electrolysis time of from 10 seconds to 5 minutes are preferable. The amount of anodized coating is preferably 1.0 g/m$^2$ or more.

When the amount is 1.0 g/m$^2$ or more, the printing durability is excellent, the non-image areas of the lithographic printing plate become resistant to scratching, and the so-called "scratch staining", which is caused by ink becoming attached to scratched areas during printing, can be suppressed.

After being subjected to the anodizing treatment, the surface of the aluminum is subjected to a hydropfilization treatment, if necessary.

With regard to the hydropfilization treatment employed in the invention, there are methods employing an alkali metal silicate (for example, an aqueous solution of sodium silicate) as disclosed in U.S. Pat. Nos. 2,714,066, 3,181,461, 3,280,734 and 3,902,734. In these methods, the substrate is immersed in an aqueous solution of sodium silicate or subjected to electrolysis. It is also possible to employ a method involving treatment with potassium fluorozirconate as disclosed in JP-B No. 36-22063, or with polyvinyl phosphonic acid as disclosed in U.S. Pat. Nos. 3,276,868, 4,153,461 and 4,689,272.

Undercoat Layer

In the planographic printing plate precursor of the invention, an undercoat layer may be provided if necessary between the substrate and the recording layer.

As undercoat layer components, various organic compounds may be used, and it may be selected among carboxymethylcellulose; dextrin; gum arabic; an amino group-containing phosphonic acid such as 2-aminoethylphosphonic acid; organic phosphonic acids such as phenyl phosphonic acid, naphthylphosphonic acid, an alkylphosphonic acid, glycerophosphonic acid, methylenediphosphonic acid, and ethylenediphosphonic acid; organic phosphoric acids such as phenylphosphoric acid, naphthylphosphoric acid, an alkylphosphoric acid, and glycerophosphoric acid; organic phosphinic acids such as phenylphosphinic acid, naphthylphosphinic acid, an alkylphosphinic acid, and glycerophosphinic acid; amino acids such as glycine and fl-alanine; and a hydroxy group-containing amine hydrochloride such as triethanolamine hydrochlorid. These undercoat layer components may be used singly or in combination of two or more kinds thereof.

The organic undercoat layer may be provided by the following method. That is, there is a method in which a solution formed by dissolving the above-mentioned organic compound in water, an organic solvent such as methanol, ethanol or methyl ethyl ketone, or a mixed solvent thereof is applied onto an aluminum plate and dried; or a method in which an aluminum plate is immersed in a solution formed by dissolving the above-mentioned organic compound in water, an organic solvent such as methanol, ethanol, methyl ethyl ketone, or a mixed solvent thereof so as to make the above-mentioned compound adsorb thereon, followed by washing with water or the like and drying to provide an organic undercoat layer. In the former method, a solution of the organic compound at a concentration of from 0.005% by mass to 10% by mass may be applied by various methods. In the latter method, the concentration of the solution is preferably from 0.01% by mass to 20% by mass, more preferably from 0.05% by mass to 5% by mass, the immersion temperature is preferably from 20° C. to 90° C., more preferably from 25° C. to 50° C., and the immersion time is preferably from 0.1 second to 20 minutes, more preferably from 2 seconds to 1 minute.

The pH of the solution used therefor can be adjusted by a basic substance such as ammonia, triethylamine, or potassium hydroxide, or an acidic substance such as hydrochloric acid or phosphoric acid so that the pH is in the range of 1 to 12. A yellow dye may be added to the solution, in order to improve the tone reproduction properties of the image recording material.

The coverage of the organic undercoat layer is preferably from 2 mg/m² to 200 mg/m², and is preferably from 5 mg/m² to 100 mg/m². When the coverage is in the above range, sufficient printing durability can be obtained.

Backcoat Layer

On the reverse surface of the substrate of the planographic printing plate precursor, a backcoat layer may be provided if necessary. With regard to the backcoat layer, a coating layer including an organic polymer compound described in JP-A No. 05-45885 or a coating layer including a metal compound oxide obtained by hydrolysis and polycondensation of an organic or inorganic metal compound described in JP-A No. 06-35174 is preferably used. Among these coating layers, use of a silicon alkoxy compound such as $Si(OCH_3)_4$, $Si(OC_2H_5)_4$, $Si(OC_3H_7)_4$ or $Si(OC_4H_9)_4$ is preferable, since starting materials are inexpensive and readily available, and the metal oxide coating layer obtained therefrom has an excellent developer resistance.

Method of Making Planographic Printing Plate

The method of making a planographic printing plate of the invention includes, in this order, an exposure step of image-wise exposing the planographic printing plate precursor of the invention; and a development step of developing using an aqueous alkaline solution containing given components, and the aqueous alkaline solution having a pH of from 8.5 to 10.8

Exposure Step

The method of making a planographic printing plate of the invention includes an exposure step of image-wise exposing the planographic printing plate precursor.

The actinic light source used for image-wise exposure of the planographic printing plate precursor is preferably a light source having an emission wavelength in the near-infrared to infrared region, and is more preferably a solid-state laser or a semiconductor laser. Among these, in the invention, it is preferable conducting image-wise exposure using a solid-state laser or a semiconductor laser that emits an infrared radiation having a wavelength of from 750 nm to 1,400 nm.

The laser output is preferably 100 mW or more, and in order to shorten the exposure time, it is preferable to use a multi-beam laser device. The exposure time per one pixel is preferably within 20 μsec.

The energy with which a planographic printing plate precursor is irradiated is preferably from 10 mJ/cm² to 300 mJ/cm². When the energy is within the above range, curing proceeds sufficiently, laser ablation can be suppressed, and damage on an image can be prevented.

Exposure in the invention may be carried out by making light beams of the light source overlap. Here, "overlap" means that the sub-scanning pitch is smaller than the beam diameter. When the beam diameter is expressed as a full width half maximum (FWHM) of the beam intensity, the overlap may be expressed quantitatively using for example FWHM/sub-scanning pitch width (overlap factor). In the invention, this overlap factor is preferably 0.1 or larger.

The scanning method of the light source of an exposure equipment that can be used in the invention is not particularly limited, and examples thereof include a cylinder outer surface scanning method, an cylinder inner surface scanning method, and a flat face scanning method. The light source channel may be a single-channel or a multi-channel, but in the case of the cylinder outer surface scanning method, multi-channel is preferably used.

Development Step

The method of making a planographic printing plate of the invention includes a development step of developing using an aqueous alkaline solution (hereinafter, also referred to as "developer" or "processing solution") containing given components, the aqueous alkaline solution having a pH of from 8.5 to 10.8

Ammonium Salt represented by Formula (I)

The developer includes an ammonium salt represented by the following Formula (I) (hereinafter, also referred to as a "specific ammonium salt").

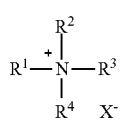
(I)

In Formula (I), $R^1$, $R^2$, $R^3$, and $R^4$ each independently represent an alkyl group or an aryl group, and the total number of carbon atoms contained in $R^1$, $R^2$, $R^3$, and $R^4$ is not more than 20. $X^-$ represents a counter anion.

In Formula (I), the alkyl group represented by $R^1$, $R^2$, $R^3$ or $R^4$ is preferably an alkyl group having 1 to 6 carbon atoms. Examples of the alkyl group include a methyl group, an ethyl group, an n-propyl group, an n-butyl group, an n-pentyl group, an -hexyl group, an i-propyl group, an i-butyl group, a t-butyl group, and a benzyl group. In addition, the alkyl group may have a substituent, and suitable examples of the alkyl group having a substituent include a benzyl group.

Additionally, two alkyl groups among $R^1$, $R^2$, $R^3$, and $R^4$ may link to each other to form a ring structure, such as a 5-membered ring or a 6-membered ring.

In Formula (I), the aryl group represented by $R^1$, $R^2$, $R^3$ or $R^4$ is preferably an aryl group having 6 to 17 carbon atoms. Examples of the aryl group include a phenyl group and a naphthyl group. In addition, the aryl group may have a substituent, and suitable examples of the aryl group having a substituent include a tolyl group.

The total number of carbon atoms contained in $R^1$, $R^2$, $R^3$, and $R^4$ is not more than 20 and preferably 8 or more, from the viewpoint of development suppression effect.

In Formula (I), a counter anion represented by $X^-$ is preferably a halogen ion and a hydroxide ion. Examples of the halogen ion include a fluorine ion, a chlorine ion, a bromine ion, and an iodine ion, and the chlorine ion and the bromine ion are preferable.

Hereinafter, specific examples of the specific ammonium salt (exemplary compounds 1 to 192) is shown, but the invention is not limited thereto.

In the specific examples shown below, Me represents a methyl group; Et represents an ethyl group; Pr represents an n-propyl group; Bu represents an n-butyl group; and Bz represents a benzyl group.

1
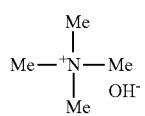

2
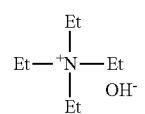

3
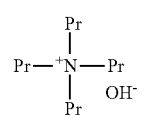

4
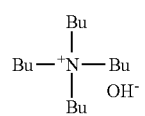

5
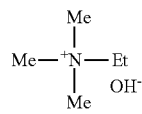

6
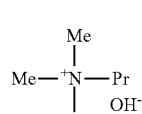

7
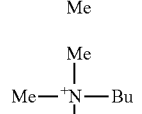

8
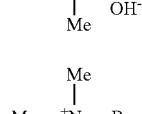

9
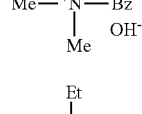

10
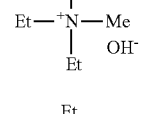

11
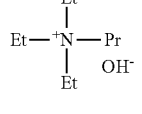

12
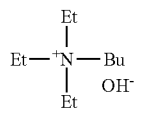

13
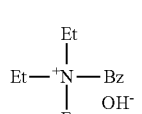

14
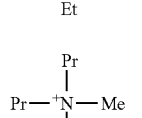

15
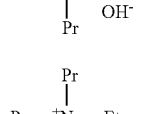

16
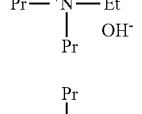

17
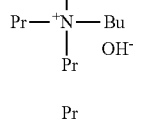

-continued
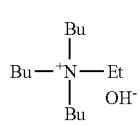 18
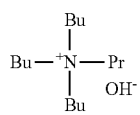 19
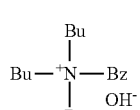 20
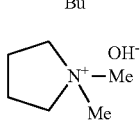 21
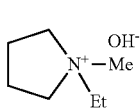 22
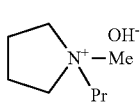 23
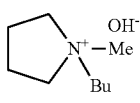 24
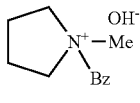 25
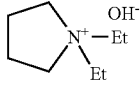 26
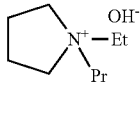 27
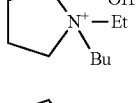 28
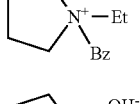 29
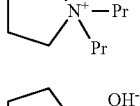 30
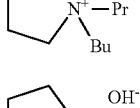 31
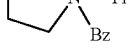 32
-continued
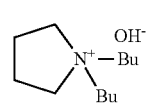 33
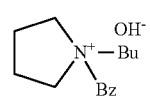 34
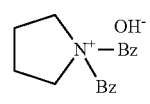 35
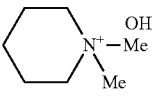 36
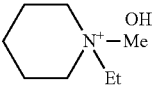 37
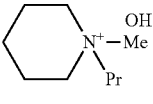 38
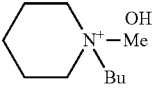 39
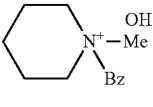 40
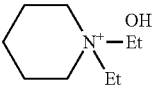 41
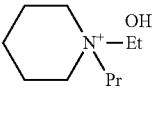 42
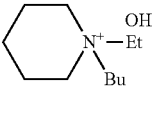 43
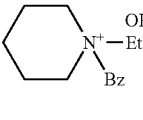 44
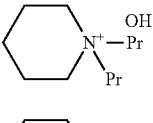 45
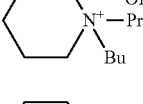 46
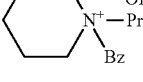 47

| # | Structure | | # | Structure |
|---|---|---|---|---|
| 48 | 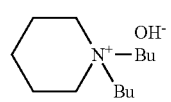 | | 61 | 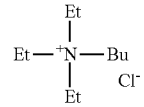 |
| 49 | 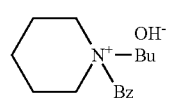 | | 62 | 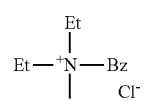 |
| 50 | 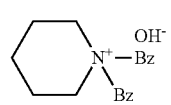 | | 63 | 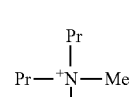 |
| 51 | 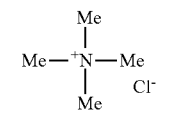 | | 64 | 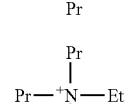 |
| 52 | 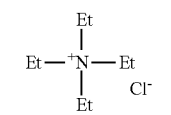 | | 65 | 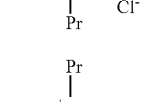 |
| 53 | 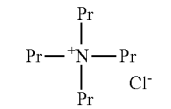 | | 66 | 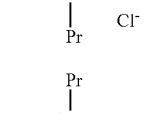 |
| 54 | 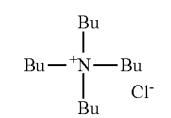 | | 67 | 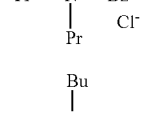 |
| 55 | 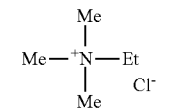 | | 68 | 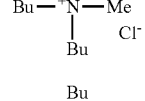 |
| 56 | 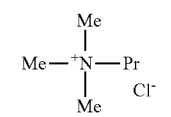 | | 69 | 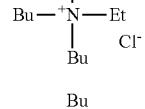 |
| 57 | 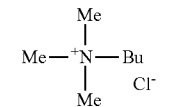 | | 70 | 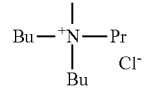 |
| 58 | 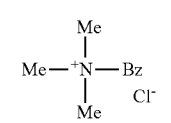 | | 71 | 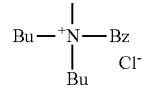 |
| 59 | 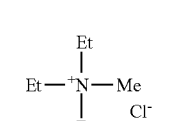 | | 72 | 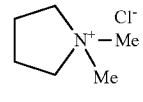 |
| 60 | 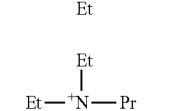 | | 73 | 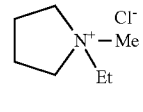 |
|    |  | | 74 | 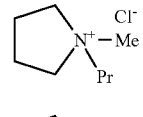 |
|    |           | |    | 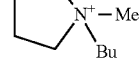 |

-continued

| # | Structure |
|---|---|
| 75 | Pyrrolidinium, N-Me, N-Bz, Cl⁻ |
| 76 | Pyrrolidinium, N-Et, N-Et, Cl⁻ |
| 77 | Pyrrolidinium, N-Et, N-Pr, Cl⁻ |
| 78 | Pyrrolidinium, N-Et, N-Bu, Cl⁻ |
| 79 | Pyrrolidinium, N-Et, N-Bz, Cl⁻ |
| 80 | Pyrrolidinium, N-Pr, N-Pr, Cl⁻ |
| 81 | Pyrrolidinium, N-Pr, N-Bu, Cl⁻ |
| 82 | Pyrrolidinium, N-Pr, N-Bz, Cl⁻ |
| 83 | Pyrrolidinium, N-Bu, N-Bu, Cl⁻ |
| 84 | Pyrrolidinium, N-Bu, N-Bz, Cl⁻ |
| 85 | Pyrrolidinium, N-Bz, N-Bz, Cl⁻ |
| 86 | Piperidinium, N-Me, N-Me, Cl⁻ |
| 87 | Piperidinium, N-Me, N-Et, Cl⁻ |
| 88 | Piperidinium, N-Me, N-Pr, Cl⁻ |
| 89 | Piperidinium, N-Me, N-Bu, Cl⁻ |
| 90 | Piperidinium, N-Me, N-Bz, Cl⁻ |
| 91 | Piperidinium, N-Et, N-Et, Cl⁻ |
| 92 | Piperidinium, N-Et, N-Pr, Cl⁻ |
| 93 | Piperidinium, N-Et, N-Bu, Cl⁻ |
| 94 | Piperidinium, N-Et, N-Bz, Cl⁻ |
| 95 | Piperidinium, N-Pr, N-Pr, Cl⁻ |
| 96 | Piperidinium, N-Pr, N-Bu, Cl⁻ |
| 97 | Piperidinium, N-Pr, N-Bz, Cl⁻ |
| 98 | Piperidinium, N-Bu, N-Bu, Cl⁻ |
| 99 | Piperidinium, N-Bu, N-Bz, Cl⁻ |
| 100 | Piperidinium, N-Bz, N-Bz, Cl⁻ |
| 101 | Me₄N⁺ Br⁻ (tetramethylammonium bromide) |
| 102 | Et₄N⁺ Br⁻ (tetraethylammonium bromide) |
| 103 | Pr₄N⁺ Br⁻ (tetrapropylammonium bromide) |

-continued
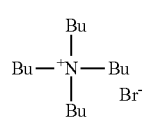 104
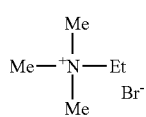 105
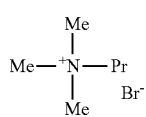 106
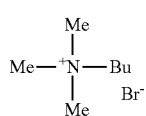 107
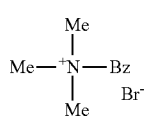 108
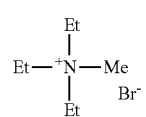 109
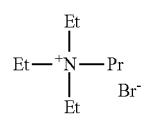 110
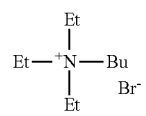 111
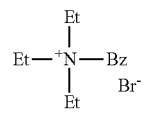 112
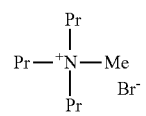 113
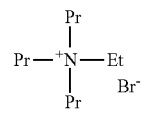 114
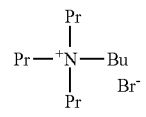 115
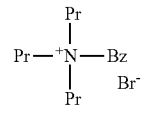 116
-continued
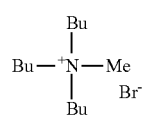 117
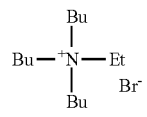 118
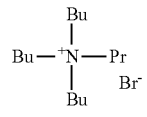 119
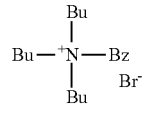 120
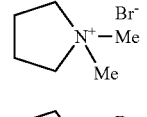 121
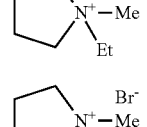 122
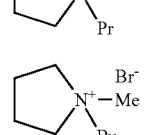 123
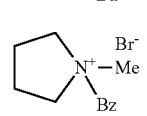 124
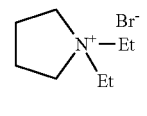 125
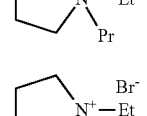 126
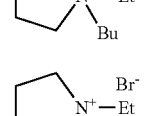 127
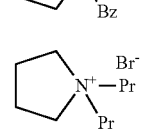 128
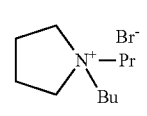 129
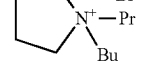 130
 131

| # | Structure |
|---|---|
| 132 | pyrrolidinium N+-Pr, Bz, Br- |
| 133 | pyrrolidinium N+-Bu, Bu, Br- |
| 134 | pyrrolidinium N+-Bu, Bz, Br- |
| 135 | pyrrolidinium N+-Bz, Bz, Br- |
| 136 | piperidinium N+-Me, Me, Br- |
| 137 | piperidinium N+-Me, Et, Br- |
| 138 | piperidinium N+-Me, Pr, Br- |
| 139 | piperidinium N+-Me, Bu, Br- |
| 140 | piperidinium N+-Me, Bz, Br- |
| 141 | piperidinium N+-Et, Et, Br- |
| 142 | piperidinium N+-Et, Pr, Br- |
| 143 | piperidinium N+-Et, Bu, Br- |
| 144 | piperidinium N+-Et, Bz, Br- |
| 145 | piperidinium N+-Pr, Pr, Br- |
| 146 | piperidinium N+-Pr, Bu, Br- |
| 147 | piperidinium N+-Pr, Bz, Br- |
| 148 | piperidinium N+-Bu, Bu, Br- |
| 149 | piperidinium N+-Bu, Bz, Br- |
| 150 | piperidinium N+-Bz, Bz, Br- |
| 151 | PhN+(Me)₃ OH- |
| 152 | PhN+(Et)₃ OH- |
| 153 | PhN+(Pr)₃ OH- |
| 154 | PhN+(Bu)₃ OH- |
| 165 | PhN+(Me)₃ Cl- |
| 166 | PhN+(Et)₃ Cl- |
| 167 | PhN+(Pr)₃ Cl- |
| 168 | PhN+(Bu)₃ Cl- |
| 179 | PhN+(Me)₃ Br- |
| 180 | PhN+(Et)₃ Br- |

-continued
| | | |
|---|---|---|
| 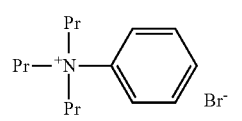 | 181 | |
| 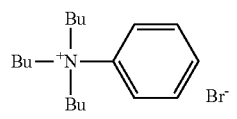 | 182 | |
| 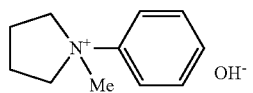 | 155 | |
| 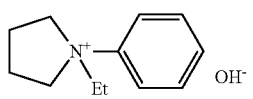 | 156 | |
| 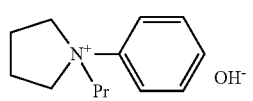 | 157 | |
| 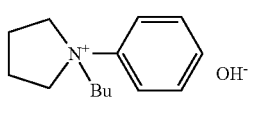 | 158 | |
| 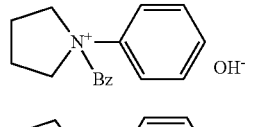 | 159 | |
| 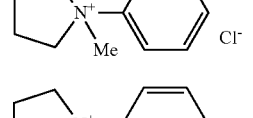 | 169 | |
| 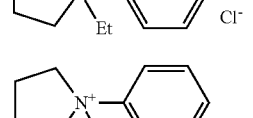 | 170 | |
| 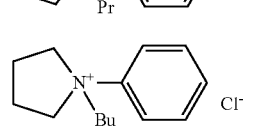 | 171 | |
| 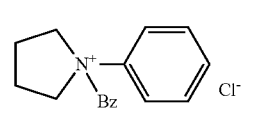 | 172 | |
| 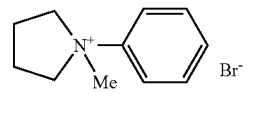 | 173 | |
| 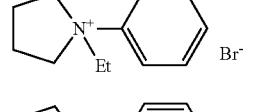 | 183 | |
| 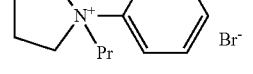 | 184 | |
| | 185 | |
-continued
| | | |
|---|---|---|
| 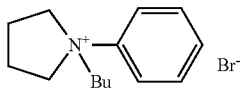 | 186 | |
| 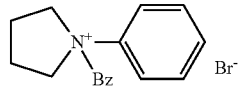 | 187 | |
| 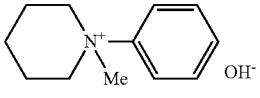 | 160 | |
| 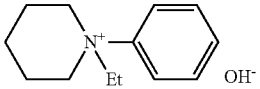 | 161 | |
| 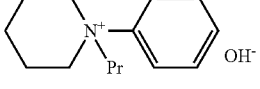 | 162 | |
| 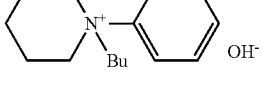 | 163 | |
| 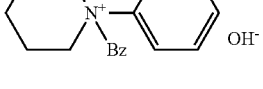 | 164 | |
| 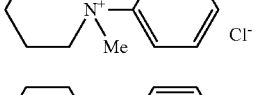 | 174 | |
| 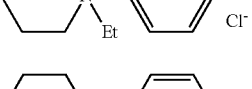 | 175 | |
| 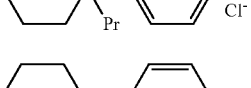 | 176 | |
| 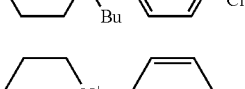 | 177 | |
| 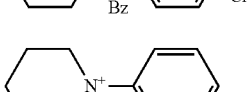 | 178 | |
| 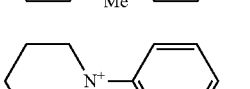 | 188 | |
| 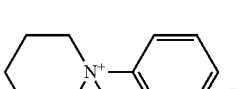 | 189 | |
| | 190 | |

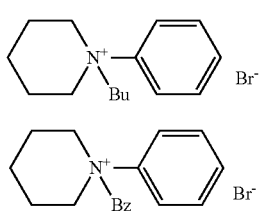

The developer may include only one specific ammonium salt or two or more specific ammonium salts.

The content of the specific ammonium salt in the developer is appropriately from 3 mg/L to 100 mg/L, preferably from 5 mg/L to 80 mg/L, and more preferably from 10 mg/L to 60 mg/L.

When the content of the specific ammonium salt in the developer is 3 mg/L or more, the development suppression effect against the aqueous alkaline solution in the image area; and when the content thereof in the developer is 100 mg/L or less, the developability of a non-image area is further improved.

Betaine-Based Amphoteric Surfactant

In the invention, the developer includes a betaine-based amphoteric surfactant.

The betaine-based amphoteric surfactant is preferably a compound represented by Formula (A) shown below or a compound represented by Formula (B) shown below.

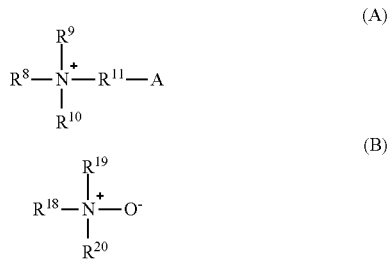

In Formula (A), $R^8$ represents an alkyl group; $R^9$ and $R^{10}$ each independently represent a hydrogen atom or an alkyl group; $R^{11}$ represents an alkylene group; and A represents a carboxylate ion or a sulfonate ion.

In Formula (B), $R^{18}$, $R^{19}$, and $R^{20}$ each independently represent a hydrogen atom or an alkyl group, provided that $R^{18}$, $R^{19}$, and $R^{20}$ are not simultaneously hydrogen atoms.

In Formula (A), the alkyl group represented by $R^8$, $R^9$, or $R^{10}$ and the alkylene group represented by $R^{11}$ may be straight-chain or branched, may have a linking group in the chain thereof, and may itself have a substituent. The linking group is preferably one containing a hetero atom, such as an ester bond, an amide bond, or an ether bond. Preferable examples of the substituent of the alkyl group include a hydroxy group, an ethylene oxide group, a phenyl group, an amide group, and a halogen atom.

Furthermore, $R^8$, $R^9$, or $R^{20}$ may be linked to each other to form a ring. The form of linking to form a ring is preferably one that forms a 5-membered ring or a 6-membered ring, and the ring is still more preferably a heterocyclic ring containing a heteroatom. The heteroatom is preferably an oxygen atom, a nitrogen atom, or a sulfur atom. It is more preferable that the ring structure is a cationic structure such as a substituted imidazole ring, a substituted imidazoline ring, or a substituted imidazolidine.

In the compound represented by Formula (A), the sum total of carbon atoms of $R^8$ to $R^{11}$ is preferably 8 to 25, and more preferably 11 to 21. When the sum total thereof is in the above range, the hydrophobic portion is appropriate, and the solubility in an aqueous developer is excellent.

In Formula (B), the alkyl group represented by $R^{18}$, $R^{19}$, or $R^{20}$ may be straight-chain or branched, may have a linking group in the chain thereof, and may itself have a substituent. The linking group is preferably one containing a hetero atom, such as an ester bond, an amide bond, or an ether bond. Preferable examples of the substituent of the alkyl group include a hydroxy group, an ethylene oxide group, a phenyl group, an amide group, and a halogen atom.

In the compound represented by Formula (B), the sum total of carbon atoms of $R^{18}$ to $R^{20}$ is preferably 8 to 22, and more preferably 10 to 20. When the sum total thereof is in the above range, the hydrophobic portion of the compound is appropriate, and the solubility in an aqueous developer is excellent.

Furthermore, by adding an organic solvent such as an alcohol as a solubilizer, the solubility of the surfactant in an aqueous developer can be increased.

The total number of carbon atoms of the betaine-based amphoteric surfactant can depend on the properties of a material used in the recording layer, in particular a binder. In the case of a highly hydrophilic binder, one in which the total number of carbon atoms is relatively small is preferable, and when the binder used has a low degree of hydrophilicity, the total number of carbon atoms is large tends to be preferable.

Hereinafter, specific examples of preferable betaine-based amphoteric surfactant is shown, but the invention is not limited thereto.

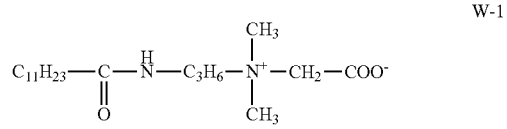

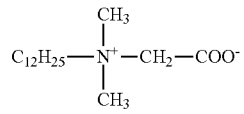

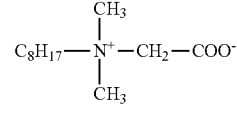

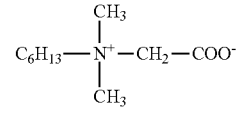

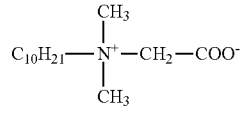

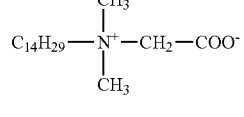

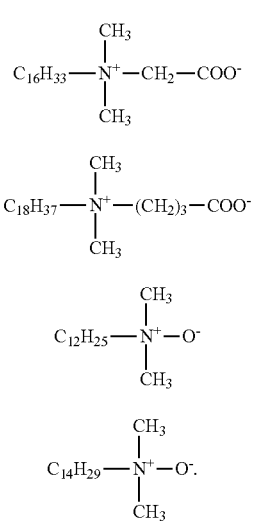

Those betaine-based amphoteric surfactants may be used singly or in combination of two or more kinds thereof.

The content of the betaine-based amphoteric surfactant in the developer is preferably from 0.1% by mass to 20% by mass, more preferably from 0.2% by mass to 10% by mass, and still more preferably from 0.3% by mass to 8% by mass.

Second Surfactant

The developer according to the invention may include a second surfactant in addition to the betaine-based amphoteric surfactant as long as the advantages of the invention are not impaired.

Examples of the second surfactant include an anionic surfactant, a nonionic surfactant, a cationic surfactant, and an second amphoteric surfactant other than betaine-based ones. The surfactant used in the invention preferably has an HLB value of 6 or more, and more preferably 8 or more, from the viewpoint of stable solubility or turbidity in water.

Preferable examples of the anionic surfactant include a fatty acid salt, an abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylene alkylsulfophenyl ether salt, sodium N-methyl-N-oleyltaurine, a disodium N-alkylsulfosuccinic acid monoamide, a petroleum sulfonic acid salt, a sulfate ester salt, a phosphate ester salt, a partially saponified styrene-maleic anhydride copolymer, a partially saponified olefin-maleic anhydride copolymer, a naphthalenesulfonic acid salt formalin condensate, an aromatic sulfonic acid salt, and an aromatic substituted polyoxyethylenesulfonic acid salt. Among these, a dialkylsulfosuccinic acid salt, an alkylsulfate ester salt, or an alkylnaphthalenesulfonic acid salt is preferably used.

Examples of the cationic surfactant include an alkylamine salt, a quaternary ammonium salt, a polyoxyethylene alkylamine salt, and a polyethylene polyamine derivative.

Examples of the nonionic surfactant include a polyethylene glycol type higher alcohol ethylene oxide adduct, an alkylphenol ethylene oxide adduct, an aromatic compound polyethylene glycol adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, a sorbitol and sorbitan fatty acid ester, a sucrose fatty acid ester, a polyhydric alcohol alkyl ether, and a alkanolamine fatty acid amide.

Examples of the amphoteric surfactant other than betaine-based ones include an amino acid-based amphoteric surfactant and an amine oxide-based amphoteric surfactant.

From the viewpoint of the developability of an exposed area, the second surfactant used in combination with the betaine-based amphoteric surfactant is preferably an anionic surfactant or a nonionic surfactant, and more preferably an anionic surfactant.

The total content of the betaine-based amphoteric surfactant and the second surfactant in the developer is preferably from 0.1% by mass to 20% by mass, more preferably from 0.2% by mass to 15% by mass, and still more preferably from 0.3% by mass to 10% by mass.

pH

The developer has a pH of from 8.5 to 10.8.

When the pH of the aqueous alkaline solution is 8.5 or more, the developability of a non-image area is not degraded, and when the pH thereof is 10.8 or less, reduction in processing performance affected by carbon dioxide in the air is suppressed. The pH of the aqueous alkaline solution is preferably from 9.0 to 10.8, and more preferably from 9.5 to 10.7.

In order to maintain the pH of the developer at 8.5 to 10.8, the addition of carbonate ion and bicarbonate ion is preferable. The presence of carbonate ion and bicarbonate ion as a buffer agent enables variation in pH to be suppressed even when the developer is used for a long period of time, thus suppressing degradation in developability due to variation in pH, the generation of development scum, and the like. In order to make carbonate ion and bicarbonate ion be present in the developer, a carbonate salt and a bicarbonate salt may be added to the developer, or carbonate ion and bicarbonate ion may be formed by adjusting the pH after a carbonate salt or a bicarbonate salt is added. The carbonate salt and the bicarbonate salt are not particularly limited, but an alkali metal salt is preferable. As the alkali metal, lithium, sodium, and potassium can be cited, and sodium is preferable. They may be used singly or in combination of two or more kinds thereof.

The total content of carbonate and bicarbonate salts with respect to a total mass of the developer is preferably from 0.3% by mass to 20% by mass, more preferably from 0.5% by mass to 10% by mass, and still more preferably from 1% by mass to 5% by mass. When the total content thereof is 0.3% by mass or more, the developability and processability do not degrade; when it is 20% by mass or less, it becomes difficult for a precipitate and crystals to form and, furthermore, it becomes difficult for a gel to form when neutralizing during developer waste solution processing, and no problems are caused in waste solution processing.

In order to finely adjust the alkali concentration or assist dissolution of a non-image area of the recording layer, another alkali agent such as for example an organic alkali agent may be supplementarily used. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These other alkali agents may be used singly or in combination of two or more kinds thereof.

The developer may include, in addition to the above-mentioned compound, a wetting agent, a preservative, a chelating compound, an antifoaming agent, an organic acid, an organic solvent, an inorganic acid, an inorganic salt, or the like. However, it is preferable not to add a water-soluble polymer compound since the surface of the plate easily becomes tacky, particularly when the developer is exhausted.

As the wetting agent, ethylene glycol, propylene glycol, triethylene glycol, butylene glycol, hexylene glycol, diethylene glycol, dipropylene glycol, glycerol, trimethylolpropane, digylcerol, and the like are preferably used. The wetting agent may be used singly or in a combination of two or more kinds thereof. The wetting agent is preferably used in an amount of 0.1% by mass to 5% by mass, with respect to a total mass of the developer.

As the preservative, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidinoguanidine derivative, a quaternary ammonium salt, a pyridine derivative, a quinoline derivative, a guanidine derivative, diazine, a triazole derivative, oxazole, an oxazine derivative, or a nitrobromoalcohol such as 2-bromo-2-nitropropane-1,3-diol, 1,1-dibromo-1-nitro-2-ethanol, or 1,1-dibromo-1-nitro-2-propanol is preferably used. It is preferable to use at least two types of preservatives in combination so as to exhibit efficacy toward various types of molds and microbes. The amount of preservative added is an amount that exhibits stable efficacy toward bacteria, molds, yeasts, etc., and depends on the type of bacteria, molds, or yeasts, but is preferably in the range of from 0.01% by mass to 4% by mass, with respect to a total mass of the developer.

Examples of the chelating compound include organic phosphonic acids and phosphonoalkanetricarboxylic acids such as ethylenediaminedisuccinate, ethylenediaminetetraacetic acid, the potassium salt thereof, or the sodium salt thereof; diethylenetriaminepentaacetic acid, the potassium salt thereof, or the sodium salt thereof triethylenetetraminehexaacetic acid, the potassium salt thereof, or the sodium salt thereof hydroxyethylethylenediaminetriacetic acid, the potassium salt thereof, or the sodium salt thereof nitrilotriacetic acid or the sodium salt thereof 1-hydroxyethane-1,1-diphosphonic acid, the potassium salt thereof, or the sodium salt thereof and aminotri(methylenephosphonic acid), the potassium salt thereof, or the sodium salt thereof. An organic amine salt is also effective instead of the sodium salt or potassium salt of the chelating compound. As the chelating agent, one that is present stably in the developer composition and does not inhibit printing properties is selected. The amount thereof added is preferably from 0.001% by mass to 1.0% by mass, with respect to a total mass of the developer.

As the antifoaming agent, a normal silicone-based self emulsifying type, emulsifying type, nonionic, etc. compound may be used, and a compound having an HLB of no greater than 5 is preferable. A silicone antifoaming agent is preferable. Among these, an emulsifying dispersion type antifoaming agent and solubilizing type antifoaming agent may be used. The content of the antifoaming agent is suitably in the range of 0.001% by mass to 1.0% by mass, with respect to a total mass of the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and an organic phosphonic acid. The organic acid may also be used in the form of an alkali metal salt or an ammonium salt. The content of the organic acid is preferably from 0.01% by mass to 5% by mass, with respect to a total mass of the developer.

Examples of the organic solvent include an aliphatic hydrocarbon (e.g. hexane, heptane, Isopar E, H, G (trade name, manufactured by Esso Chemical Co., Ltd.), gasoline, or kerosene), an aromatic hydrocarbon (e.g. toluene or xylene), a halogenated hydrocarbon (e.g. methylene dichloride, ethylene dichloride, triclene, or monochlorobenzene), and a polar solvent.

Examples of the polar solvent include alcohols (methanol, ethanol, propanol, isopropanol, benzyl alcohol, ethylene glycol monomethyl ether, 2-ethoxyethanol, etc.), ketones (methyl ethyl ketone, cyclohexanone, etc.), esters (ethyl acetate, methyl lactate, propylene glycol monomethyl ether acetate, etc.), and others (triethyl phosphate, tricresyl phosphate, N-phenylethanolamine, N-phenyldiethanolamine, etc.).

Furthermore, when the organic solvent is insoluble in water, it may be employed by being solubilized in water using a surfactant or the like. In the case where the developer contains an organic solvent, the concentration of the organic solvent is preferably less than 40% by mass from the viewpoint of safety and inflammability.

Examples of the inorganic acid and the inorganic salt include phosphoric acid, metaphosphoric acid, monoammonium phosphate, diammonium phosphate, monosodium phosphate, disodium phosphate, monopotassium phosphate, dipotassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably from 0.01% by mass to 0.5% by mass, with respect to a total mass of the developer.

The development temperature is not particularly limited as long as development is possible, but is preferably 60° C. or lower, and more preferably from 15° C. to 40° C. In development processing using an automatic processor, since the developer might be exhausted depending on the amount processed, the processing performance may be recovered by use of a replenisher or fresh developer. As one example of development and post-development treatments, there is a method in which alkali development is carried out, the alkali is removed by a water washing post-step, a gumming treatment is carried out in a gumming step, and drying is carried out in a drying step. Other preferable examples of the treatment include a method in which water pre-washing, development, and gumming are carried out at the same time using an aqueous solution containing carbonate ion, bicarbonate ion, and a surfactant. Therefore although a water washing pre-step does not particularly need to be carried out, it is preferable to carry out a drying step after carrying out water pre-washing, development, and gumming by the use of one solution and, furthermore, with one bath. It is preferable to carry out drying subsequent to removal of extra developer using a squeegee roller or the like after development.

The development step is preferably carried out by an automatic processor equipped with and a rubbing member. Examples of the automatic processor include an automatic processor described in JP-A-2-220061 and JP-A-60-59351 in which a planographic printing plate precursor after image-wise exposure is subjected to a rubbing treatment while being transported; and an automatic processor described in U.S. Pat. Nos. 5,148,746 and 5,568,768 and GB Patent No. 2,297,719 in which a planographic printing plate precursor after image-wise exposure is placed on a cylinder and subjected to a rubbing treatment while rotating the cylinder. Among these, an automatic processor using a rotating brush roller as the rubbing member is preferable.

The rotating brush roller may be appropriately selected by taking account, for example, of the scratch resistance of the image area and the robustness of the substrate of the planographic printing plate precursor. As the rotating brush roller, a known rotating brush roller produced by implanting a brush material in a plastic or metal roller may be used. For example, a rotating brush roller described in JP-A-58-159533 and JP-A-3-100554, or a brush roller described in Japanese examined utility model application publication (JU-B) No. 62-167253, in which a metal or plastic groove-shaped member having implanted in rows therein a brush material is closely radially wrapped around a plastic or metal roller acting as a core, may be used.

As the brush material, a plastic fiber (for example, a polyester-based synthetic fiber such as polyethylene terephthalate or polybutylene terephthalate; a polyamide-based synthetic fiber such as nylon 6,6 or nylon 6,10; a polyacrylic synthetic fiber such as polyacrylonitrile or a polyalkyl (meth)acrylate; or a polyolefin-based synthetic fiber such as polypropylene or polystyrene) may be used. For example, a brush material having a fiber bristle diameter of 20 μm to 400 μm and a bristle length of 5 mm to 30 mm may preferably be used.

The external diameter of the rotating brush roller is preferably from 30 mm to 200 mm, and the rotation speed at the tip of the brush which rubs the surface of the plate is preferably from 0.1 msec to 5 msec. Plural number of the rotation brush rollers is preferably used.

The direction of rotation of the rotating brush roller may be the same direction or the opposite direction with respect to the transport direction of the planographic printing plate precursor, but when two or more rotating brush rollers are used in an automatic processor, it is preferable that at least one rotating brush roller rotates in the same direction and at least one rotating brush roller rotates in the opposite direction. By such an arrangement, the recording layer in the non-image area can be more reliably removed. Furthermore, rocking the rotating brush roller in the rotational axis direction of the brush roller is also effective.

After the development step, the drying step is preferably provided consecutively or non-consecutively. Drying is conducted by hot air, infrared ray, far-infrared ray or the like One example of the configuration of an automatic processor preferably used in the process for making a planographic printing plate of the present invention is schematically illustrated in FIG. 1. The automatic processor shown in FIG. 1 basically includes a development section 6 and a drying section 10, and a planographic printing plate precursor 4 is subjected to development and gumming in a development tank 20 and drying in the drying section 10.

Furthermore, for the purpose of improving printing durability or the like, the printing plate after development may be heated under very severe conditions. The heating temperature is usually in the range of 200° C. to 500° C. When the temperature is low, a sufficient image strengthening effect cannot be obtained, and when it is too high, there might be problems such as degradation of the substrate or thermal decomposition of the image area.

The planographic printing plate thus obtained is set in an offset printer, and suitably used for printing of a large number of sheets.

EXAMPLES

The present invention is explained below by reference to Examples, but the scope of the present invention is not limited to these Examples. In addition, "parts" and "%" mean "parts by mass" and "% by mass" respectively unless otherwise specified.

Examples 1 to 15 and Comparative Example 1

Preparation of planographic printing plate precursor
Preparation of Substrate

A 0.24 mm thick aluminum plate (an aluminum alloy containing Si: 0.06%, Fe: 0.30%, Cu: 0.014%, Mn: 0.001%, Mg: 0.001%, Zn: 0.001%, and Ti: 0.03%, the remainder being unavoidable impurities of Al) was subjected to the surface treatments shown below in succession.

An electrochemical roughening treatment was carried out continuously using an AC voltage of 60 Hz. An electrolyte here was a 10 g/liter aqueous solution of nitric acid (containing 5 g/liter of aluminum ion and 0.007% of ammonium ion), and the temperature was 80° C. After washing with water, the aluminum plate was subjected to an etching treatment at 32° C. by means of a spray using a caustic soda concentration of 26% and an aluminum ion concentration of 6.5%, thus dissolving 0.20 g/m² of the aluminum plate, and washing with water was carried out by means of a spray. Subsequently, it was subjected to a desmutting treatment by means of a spray using a 25% concentration aqueous solution of sulfuric acid (containing 0.5% of aluminum ion) at a temperature of 60° C., and washed with water by means of a spray.

An anodizing treatment was carried out using anodizing equipment employing a two-stage power supply electrolysis method. As an electrolyte that had been supplied to an electrolysis section, sulfuric acid was used. Subsequently, washing with water was carried out by means of a spray. The final amount of anodized film was 2.7 g/m².

An aluminum substrate obtained by the anodizing treatment was immersed in a treatment bath with a 1% aqueous solution of No. 3 sodium silicate at a temperature of 30° C. for 10 sec, thus carrying out an alkali metal silicate treatment (silicate treatment). Subsequently, washing with water was carried out by means of a spray.

The aluminum substrate that had been subjected to the alkali metal silicate treatment as described above was coated with an undercoat solution having the composition below and dried at 80° C. for 15 sec, thus giving a coating. The dry coverage of the coating was 15 mg/m².

Undercoat Solution

| β-Alanine | 0.5 parts |
|---|---|
| Methanol | 95 parts |
| Water | 5 parts |

Formation of Recording Layer

The substrate obtained as above was coated using a bar coater with lower layer coating solution 1 having the composition below at an amount of 1.5 g/m², then dried at 160° C. for 44 seconds, and immediately cooled down by means of cooled air at 17° C. to 20° C. until the temperature of the substrate became 35° C.

Lower layer coating solution 1

Water-insoluble and alkali-soluble resin (b-1) (N-phenylmaleimide/methacrylic acid/methacrylamide copolymer): 5.21 parts Infrared absorbing agent, cyanine dye A (the following structure): 0.94 parts Crystal Violet (manufactured by Hodogaya Chemical Co., Ltd.): 0.08 parts
MEGAFAC F-177 (fluorine-based surfactant manufactured by DIC Corporation): 0.05 parts
γ-Butyrolactone: 10 parts
Methyl ethyl ketone: 61 parts
1-Methoxy-2-propanol: 14 parts
Water: 9.34 parts Cyanine dye A Subsequently, upper layer coating solution 1 having the composition below was applied using a bar coater at an amount of 0.5 g/m$^2$, drying was carried out at 130° C. for 40 seconds and gradual cooling was carried out by blowing at 20° C. to 26, thus giving a planographic printing plate precursor.

Upper Layer Coating Solution 1
Specific copolymer (a-1): styrene/acrylonitrile/methacrylic acid copolymer (composition ratio: 69 mol %/25 mol %/6 mol %; weight-average molecular weight: 45,000): 20 parts
Polyurethane 1 below obtained by polymerization of isocyanate and diol at a mole ratio of 1:1 (weight-average molecular weight: 36,000): 10 parts
Ethyl Violet: 0.03 parts
MEGAFAC F-177 (fluorine-based surfactant manufactured by DIC Corporation): 0.05 parts
3-Pentanone: 60 parts
Propylene glycol monomethyl ether 2-acetate: 8 parts Platemaking from Planographic Printing Plate Precursor
The obtained planographic printing plate precursor was subjected to platemaking by the exposure step and the development step of the method of the invention.

Exposure Step
The obtained planographic printing plate precursor was cut into a size of 1,030 mm×800 mm and subjected to image-wise writting of a test pattern using an infrared semiconductor laser (TRENDSETTER 3244VX manufactured by Creo Inc.: equipped with a water cooled 40 W infrared semiconductor laser) at an exposure energy of 150 mJ/cm$^2$.

Development Step
The planographic printing plate precursor after the exposure was developed using any one of specific developers A1 to A19 having the compositions below by means of the automatic development processer shown in FIG. 1 (development tank: 25 L; plate transport speed: 100 cm/min; one brush roll having an outer diameter of 50 mm and having implanted therein fibers of polybutylene terephthalate (bristle diameter: 200 μm; bristle length: 17 mm) and being rotated at 200 rpm in the same direction as the transport direction (peripheral speed at brush tip: 0.52 m/sec), drying temperature 80° C.), thereby obtaining a planographic printing plate of Examples 1 to 15 or Comparative Example 1.

Compositions of Specific Developers A1 to A16
Water: 766 parts
Sodium carbonate: 12.8 parts
Sodium bicarbonate: 7.0 parts
Sodium gluconate: 15.5 parts
SOFTAZOLINE LPB-R (30% aqueous solution of lauric acid amidopropyl betaine: betaine-based amphoteric surfactant manufactured by Kawaken Fine Chemicals Co., Ltd.): 154.0 parts
SOFTAZOLINE LAO (30% aqueous solution of lauramidopropylamine oxide: amine oxide-based amphoteric surfactant manufactured by Kawaken Fine Chemicals Co., Ltd.): 38.0 parts
Specific ammonium salt (shown in Table 1): amounts shown in Table 1
Ethylenediamine disuccinate: 6.7 parts
pH: 9.85

Evaluation of Dissolution Resistance of Image Areas and Solubility of Non-Image Areas
With regard to each of the planographic printing plates of Examples 1 to 15 and Comparative Example 1 obtained above, the dissolution resistance of the image area in the developer and the solubility of the non-image area in the developer were evaluated based on the optical density (OD value) of an non-image area and the reduction in optical density (OD value) of an image area. The evaluation method is as follows. The results are shown in Table 1.

Evaluation Method
Reduction in Optical Density (OD Value) of Image Areas
After the exposure, the cyanogen concentration (OD1) of a non-exposed area (image area) in the recording layer of the planographic printing plate precursor before the development process and the cyanogen concentration (OD2) in the image area of each planographic printing plate subjected to evaluation were measured using a spectrophotometer SPECTROEYE manufactured by Gretag Macbeth Inc.

The difference between the obtained OD1 and OD2 (OD1-OD2) was regarded as the reduction in optical density (OD value) of the image area. The smaller the difference in the reduction in optical density, the more favorable the evaluation of the dissolution resistance of the image area. The results are shown in Table 1.

Optical Density (OD Value) of Non-Image Areas
The cyanogen concentration of the non-image area of each planographic printing plate subjected to evaluation was measured using the spectrophotometer SPECTROEYE manufactured by Gretag Macbeth Inc. The results are shown in Table 1.

TABLE 1

| | | Specific ammonium salt | | Evaluation | |
|---|---|---|---|---|---|
| | | | | Reduction in | OD value of |
| | Developer | Compound | Amount of addition | OD value of image area | non-image area |
| Example 1 | A1 | Exemplary compound 40 | 0.004 parts (4 mg/L) | 0.05 | 0.70 |
| Example 2 | A2 | Exemplary compound 40 | 0.008 parts (8 mg/L) | 0.02 | 0.70 |
| Example 3 | A3 | Exemplary compound 40 | 0.02 parts (20 mg/L) | 0.00 | 0.70 |
| Example 4 | A4 | Exemplary compound 40 | 0.04 parts (40 mg/L) | 0.00 | 0.70 |
| Example 5 | A5 | Exemplary compound 40 | 0.07 parts (70 mg/L) | 0.00 | 0.71 |
| Example 6 | A6 | Exemplary compound 40 | 0.09 parts (90 mg/L) | 0.00 | 0.72 |
| Example 7 | A7 | Exemplary compound 3 | 0.04 parts (40 mg/L) | 0.00 | 0.70 |
| Example 8 | A8 | Exemplary compound 8 | 0.04 parts (40 mg/L) | 0.00 | 0.70 |
| Example 9 | A9 | Exemplary compound 12 | 0.04 parts (40 mg/L) | 0.00 | 0.70 |
| Example 10 | A10 | Exemplary compound 16 | 0.04 parts (40 mg/L) | 0.00 | 0.70 |
| Example 11 | A11 | Exemplary compound 25 | 0.04 parts (40 mg/L) | 0.00 | 0.70 |
| Example 12 | A12 | Exemplary compound 7 | 0.04 parts (40 mg/L) | 0.02 | 0.70 |
| Example 13 | A13 | Exemplary compound 1 | 0.04 parts (40 mg/L) | 0.05 | 0.70 |
| Example 14 | A14 | Exemplary compound 90 | 0.04 parts (40 mg/L) | 0.00 | 0.70 |
| Example 15 | A15 | Exemplary compound 140 | 0.04 parts (40 mg/L) | 0.00 | 0.70 |
| Comparative Example 1 | A16 | — | — | 0.15 | 0.70 |

From the results of Table 1, the comparison between the respective Examples and the Comparative Example revealed that in accordance with the method of making a planographic printing plate of the invention, the dissolution resistance of an image area is significantly increased, and the solubility of a non-image area is also improved.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of making a planographic printing plate, the method comprising, in this order:
   image-wise exposing, to infrared light, a positive-working planographic printing plate precursor comprising a positive-working recording layer provided on a substrate; and
   developing the positive-working planographic printing plate precursor after the exposure using an aqueous alkaline solution,
   wherein the positive-working recording layer comprises a copolymer (A) containing a structural unit derived from (meth)acrylonitrile and a structural unit derived from styrene, a water-insoluble and alkali-soluble resin (B), and an infrared absorbing agent (C), the solubility of the positive-working recording layer in the aqueous alkaline solution being increased by the exposure to infrared light, and wherein the aqueous alkaline solution has a pH of from 8.5 to 10.8 and contains a betaine-based amphoteric surfactant and an ammonium salt represented by the following Formula (I):

wherein, in Formula (I), $R^1$, $R^2$, $R^3$, and $R^4$ each independently represent an alkyl group or an aryl group; two groups among $R^1$, $R^2$, $R^3$, and $R^4$ are alkyl groups that link to each other to form a ring structure; the total number of carbon atoms contained in $R^1$, $R^2$, $R^3$, and $R^4$ is from 8 to 20; and $X^-$ represents a counter anion.

2. The method of making a planographic printing plate according to claim 1, wherein the positive-working recording layer has a multilayer structure comprising an upper layer that contains the copolymer (A) containing a structural unit derived from (meth)acrylonitrile and a structural unit derived from styrene, and a lower layer that contains the water-insoluble and alkali-soluble resin (B), and wherein either one or both of the upper and lower layers comprises the infrared absorbing agent (C).

3. The method of making a planographic printing plate according to claim 1, wherein the copolymer (A) further comprises a structural unit derived from an ethylenically unsaturated monomer having an alkali-soluble group.

4. The method of making a planographic printing plate according to claim 1, wherein the water-insoluble and alkali-soluble resin (B) is a polymer formed by polymerization of at least one selected from the group consisting of an ethylenically unsaturated monomer having an acidic group, an alkyl (meth)acrylate, a (meth)acrylic acid ester having an aliphatic hydroxy group, (meth)acrylamide, a vinyl ester, a styrene compound, a nitrogen atom-containing monomer, and a maleimide compound.

5. The method of making a planographic printing plate according to claim 1, wherein the positive-working recording layer further comprises at least one selected from the group consisting of an alkali-soluble polyurethane resin, an alkali-soluble phenol resin, an alkali-soluble resin having a urea bond in a side chain thereof, an alkali-soluble polyamide resin, an alkali-soluble epoxy resin, an alkali-soluble polyacetal resin, and an alkali-soluble polystyrene-based resin.

6. The method of making a planographic printing plate according to claim 1, wherein each alkyl group represented by $R^1$, $R^2$, $R^3$, or $R^4$ in Formula (I) is an alkyl group having 1 to 6 carbon atoms.

7. The method of making a planographic printing plate according to claim 1, wherein the betaine-based amphoteric surfactant is a compound represented by the following Formula (A) or Formula (B):

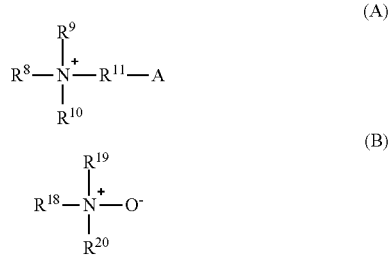

wherein, in Formula (A), $R^8$ represents an alkyl group; $R^9$ and $R^{10}$ each independently represent a hydrogen atom or an alkyl group; $R^H$ represents an alkylene group; and A represents a carboxylate ion or a sulfonate ion, and in Formula (B), $R^{18}$, $R^{19}$, and $R^{20}$ each independently represent a hydrogen atom or an alkyl group, provided that $R^{18}$, $R^{19}$, and $R^{20}$ are not simultaneously hydrogen atoms.

8. The method of making a planographic printing plate according to claim 7, wherein the betaine-based amphoteric surfactant is a compound represented by Formula (A), and the total number of carbon atoms contained in $R^8$ to $R^{11}$ in Formula (A) is from 8 to 25.

9. The method of making a planographic printing plate according to claim 7, wherein the betaine-based amphoteric surfactant is a compound represented by Formula (B), and the total number of carbon atoms contained in $R^{18}$ to $R^{20}$ in Formula (B) is from 8 to 22.

10. A method of making a planographic printing plate, the method comprising, in this order:
   image-wise exposing, to infrared light, a positive-working planographic printing plate precursor comprising a positive-working recording layer provided on a substrate; and
   developing the positive-working planographic printing plate precursor after the exposure using an aqueous alkaline solution,
   wherein the positive-working recording layer comprises a copolymer (A) containing a structural unit derived from (meth)acrylonitrile and at structural unit derived from styrene, a water-insoluble and alkali-soluble resin (B), and an infrared absorbing agent (C), the solubility of the positive-working recording layer in the aqueous alkaline solution being increased by the exposure to infrared light, and wherein the aqueous alkaline solution has a pH of from 8.5 to 10.8 and contains a betaine-based amphoteric surfactant and an ammonium salt represented by the following Formula (I):

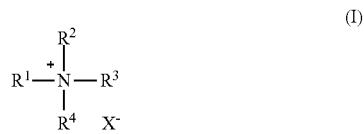

wherein, in Formula (I), $R^1$, $R^2$, $R^3$, and $R^4$ each independently represent an alkyl group or an aryl group; the total number of carbon atoms contained in $R^1$, $R^2$, $R^3$, and $R^4$ is from 8 to 20; and $X^-$ represents a counter anion that is selected from the group consisting of a fluorine ion, a chlorine ion, a bromine ion, an iodine ion, and a hydroxide ion.

11. The method of making a planographic printing plate according to claim 10, wherein the positive-working recording layer has a multilayer structure comprising an upper layer that contains the copolymer (A) containing a structural unit derived from (meth)acrylonitrile and a structural unit derived from styrene, and a lower layer that contains the water-insoluble and alkali-soluble resin (B), and wherein either one or both of the upper and lower layers comprises the infrared absorbing agent (C).

12. The method of making a planographic printing plate according to claim 10, wherein the copolymer (A) further comprises a structural unit derived from an ethylenically unsaturated monomer having an alkali-soluble group.

13. The method of making a planographic printing plate according to claim 10, wherein the water-insoluble and alkali-soluble resin (B) is a polymer formed by polymerization of at least one selected from the group consisting of an ethylenically unsaturated monomer having an acidic group, an alkyl (meth)acrylate, a (meth)acrylic acid ester having an aliphatic hydroxy group, (meth)acrylamide, a vinyl ester, a styrene compound, a nitrogen atom-containing monomer, and a maleimide compound.

14. The method of making a planographic printing plate according to claim 10, wherein the positive-working recording layer further comprises at least one selected from the group consisting of an alkali-soluble polyurethane resin, an alkali-soluble phenol resin, an alkali-soluble resin having a urea bond in a side chain thereof, an alkali-soluble polyamide resin, an alkali-soluble epoxy resin, an alkali-soluble polyacetal resin, and an alkali-soluble polystyrene-based resin.

15. The method of making a planographic printing plate according to claim 10, wherein each alkyl group represented by $R^1$, $R^2$, $R^3$, or $R^4$ in Formula (I) is an alkyl group having 1 to 6 carbon atoms.

16. The method of making a planographic printing plate according to claim 10, wherein the betaine-based amphoteric surfactant is a compound represented by the following Formula (A) or Formula (B):

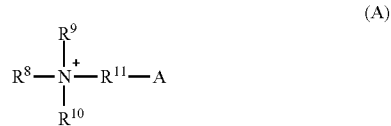

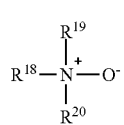

(B)

wherein, in Formula (A), $R^8$ represents an alkyl group; $R^9$ and $R^{10}$ each independently represent a hydrogen atom or an alkyl group; $R^{11}$ represents an alkylene group; and A represents a carboxylate ion or a sulfonate ion, and in Formula (B), $R^{18}$, $R^{19}$, and $R^{20}$ each independently represent a hydrogen atom or an alkyl group, provided that $R^{18}$, $R^{19}$, and $R^{20}$ are not simultaneously hydrogen atoms.

17. The method of making a planographic printing plate according to claim 16, wherein the betaine-based amphoteric surfactant is a compound represented by Formula (A), and the total number of carbon atoms contained in $R^8$ to $R^{11}$ in Formula (A) is from 8 to 25.

18. The method of making a planographic printing plate according to claim 16, wherein the betaine-based amphoteric surfactant is a compound represented by Formula (B), and the total number of carbon atoms contained in $R^{18}$ to $R^{20}$ in Formula (B) is from 8 to 22.

* * * * *